US012538596B2

(12) United States Patent
Liu

(10) Patent No.: US 12,538,596 B2
(45) Date of Patent: Jan. 27, 2026

(54) SENSOR DEVICE AND METHOD FOR FORMING THE SAME

(71) Applicant: Taiwan Semiconductor Manufacturing Company, Ltd., Hsinchu (TW)

(72) Inventor: Po-Chun Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 382 days.

(21) Appl. No.: 18/155,102

(22) Filed: Jan. 17, 2023

(65) Prior Publication Data

US 2024/0145499 A1 May 2, 2024

Related U.S. Application Data

(60) Provisional application No. 63/421,271, filed on Nov. 1, 2022.

(51) Int. Cl.
*H10F 39/00* (2025.01)
*H10F 39/18* (2025.01)

(52) U.S. Cl.
CPC ....... *H10F 39/8033* (2025.01); *H10F 39/014* (2025.01); *H10F 39/184* (2025.01);
(Continued)

(58) Field of Classification Search
CPC ... H10F 39/8033; H10F 39/014; H10F 39/184
See application file for complete search history.

(56) References Cited

U.S. PATENT DOCUMENTS

| 10,014,340 B2 | 7/2018 | Yang et al. |
| 2018/0026147 A1 | 1/2018 | Zhang et al. |

(Continued)

FOREIGN PATENT DOCUMENTS

| CN | 109300992 A | 2/2019 |
| CN | 113314638 A | 8/2021 |
| WO | 2022179171 A | 9/2022 |

OTHER PUBLICATIONS

Vines et al. "High performance planar germanium-on-silicon single-photon avalanche diode detectors" Nature Communications (2019) 10:1086, published on Mar. 6, 2019.
(Continued)

*Primary Examiner* — Brian Turner
(74) *Attorney, Agent, or Firm* — Eschweiler & Potashnik, LLC

(57) ABSTRACT

Various embodiments of the present disclosure are directed towards a sensor device comprising a photodetector with a simplified manufacturing process. A semiconductor substrate comprises an avalanche region at which a p-type region and an n-type region form a PN junction. An inner absorption layer is recessed into the semiconductor substrate, wherein the inner absorption layer has a bottom protrusion protruding towards the avalanche region. A peripheral absorption layer is on a sidewall of the inner absorption layer and a bottom of the inner absorption layer and further extends from the sidewall to the bottom protrusion. The inner absorption layer and the peripheral absorption layer share a common semiconductor material and have a smaller bandgap than the semiconductor substrate. Further, the peripheral absorption layer has a doping concentration that is elevated relative to a doping concentration of the inner absorption layer.

20 Claims, 27 Drawing Sheets

(52) U.S. Cl.
CPC ....... *H10F 39/8063* (2025.01); *H10F 39/807* (2025.01); *H10F 39/809* (2025.01)

(56) References Cited

U.S. PATENT DOCUMENTS

| | | |
|---|---|---|
| 2022/0045109 A1 | 2/2022 | Wang et al. |
| 2022/0050184 A1 | 2/2022 | Paul et al. |
| 2022/0190184 A1 | 6/2022 | Rideau et al. |
| 2022/0271080 A1* | 8/2022 | Sze ................. H10F 39/807 |
| 2023/0011366 A1 | 1/2023 | Miura |
| 2023/0040457 A1 | 2/2023 | Tanaka et al. |
| 2023/0207719 A1 | 6/2023 | Chien et al. |
| 2023/0369360 A1 | 11/2023 | Hung et al. |

OTHER PUBLICATIONS

Wikipedia.org. "Single-photon avalanche diode" Published on Oct. 26, 2022.

* cited by examiner

SENSOR DEVICE AND METHOD FOR FORMING THE SAME

REFERENCE TO RELATED APPLICATION

This application claims the benefit of U.S. Provisional Application No. 63/421,271, filed on Nov. 1, 2022, the contents of which are incorporated herein by reference in their entirety.

BACKGROUND

A single-photon avalanche diode (SPAD) is a solid-state photodetector based around a semiconductor p-n junction. During operation, a photo-generated carrier is accelerated by an electric field in a bulk material of the SPAD to a kinetic energy that is enough to overcome ionization energy of the bulk material, thereby knocking electrons out of an atom of the bulk material. A large avalanche of current carriers results and grows exponentially to yield a short duration trigger pulse. Hence, the SPAD can be used detect as few as a single photo-generated carrier. Further, because of the high speed of the avalanche buildup, the leading edge of the pulse can be used to obtain the time of arrival of a photo-generated carrier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
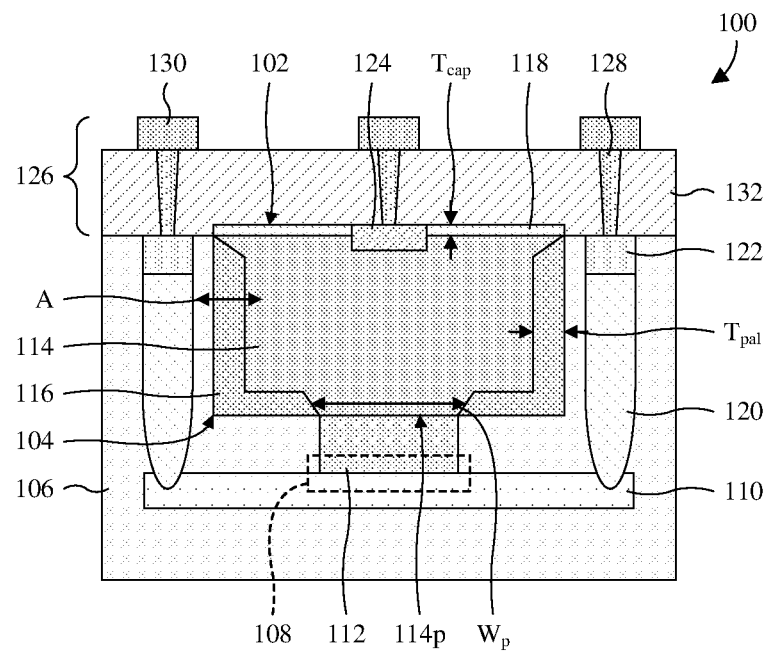
FIG. 1 illustrates a cross-sectional view of some embodiments of a sensor device comprising a photodetector according to aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Short wavelength infrared (SWIR) sensor devices often include single photon avalanche diodes (SPADs) for indirect time-of-flight (iToF) depth sensing. iToF depth sensing applications include, among other things, three-dimensional (3D) imaging and ranging on advanced driver assistance systems (ADAS). Such an SPAD may comprise a germanium absorption structure overlying and recessed into a silicon substrate, as well as an avalanche region underlying the germanium absorption structure in the silicon substrate.

The germanium absorption structure provides enhanced absorption for SWIR radiation compared to silicon due to its small bandgap compared to silicon. However, the germanium absorption structure may result in high dark current, which may result in a high dark count rate (DCR) and may hence negatively impact performance. The high dark current dominates at an interface between the germanium absorption structure and the silicon substrate and may result from: 1) the small bandgap; 2) crystalline defects in the germanium absorption structure; and 3) interface states between the silicon substrate and the germanium absorption structure. The crystalline defects and the interface states may arise while epitaxially growing the germanium absorption structure on the silicon substrate due to lattice mismatch.

To reduce dark current, the SPAD may be formed with a p-type interface region in the silicon substrate, at or near the interface between the germanium absorption structure and the silicon substrate. Further, the SPAD may be formed with a p-type guard ring in the germanium absorption structure, extending along a periphery of the germanium absorption structure. Because of the p-type doping, the p-type interface region and the p-type guard ring are hole rich and passivate crystalline defects and interface states to suppress dark current. However, the p-type interface region and the p-type guard ring are formed by selective ion implantation using photolithography, which increases manufacturing complexity. Further, ion implantation during formation the p-type interface region causes damage to the silicon substrate and depends on thermal processing for repair, which adds further manufacturing complexity.

Various embodiments of the present disclosure are directed towards a SWIR sensor device comprising an SPAD with reduced manufacturing complexity. As seen hereafter, the reduce manufacturing complexity stems from omitting a p-type interface region in a silicon substrate and a p-type guard ring in a germanium absorption structure. The germanium absorption structure comprises an inner germanium layer and a peripheral absorption layer.

The inner germanium layer is recessed into the silicon substrate and has a bottom protrusion protruding through the peripheral germanium layer towards an avalanche region. The peripheral germanium layer is at an interface between the germanium absorption structure and the silicon substrate. Further, the peripheral germanium layer is on a sidewall of the inner germanium layer and a bottom of the inner germanium layer, and further extends from the sidewall to the bottom protrusion. The inner germanium layer is intrinsic or lightly doped, whereas the peripheral germanium layer is highly doped with p-type dopants. Hence, the peripheral germanium layer is hole rich and passivates crystalline defects and interface states to suppress dark current.

Because the peripheral germanium layer suppresses dark current, the peripheral germanium layer acts as a replacement for the p-type interface region and the p-type guard ring. Further, because the number of regions/structures for suppressing dark current is reduced from two to one, manufacturing complexity is reduced. For example, photolithography and ion implantation from formation of the p-type guard ring may be saved.

In contrast with the p-type interface region, the peripheral germanium layer may be formed by a self-aligned epitaxial growth process in which the peripheral germanium layer is simultaneously grown and doped on the silicon substrate. Because the peripheral germanium layer is simultaneously grown and doped, formation thereof does not include ion implantation into the silicon substrate and hence does not damage the silicon substrate. As such, ion implantation and thermal processing from formation of the p-type interface region may be saved.

With reference to FIG. 1, a cross-sectional view 100 of some embodiments of a sensor device comprising a photodetector 102 according to aspects of the present disclosure is provided. The photodetector 102 comprises an absorption structure 104 overlying and recessed into a semiconductor substrate 106, and further comprises an avalanche region 108 underlying the absorption structure 104 in the semiconductor substrate 106. The photodetector 102 may, for example, be an SPAD, an avalanche photodiode (APD), or the like.

The avalanche region 108 corresponds to a region at which photo-generated carriers from the absorption structure 104 are multiplied by the avalanche effect. Hence, the avalanche region 108 may also be referred to as a multiplication region or the like. The avalanche region 108 is formed by a PN junction at which a first avalanche well 110 and a second avalanche well 112 directly contact. The first avalanche well 110 and the second avalanche well 112 underlie the absorption structure 104 in the semiconductor substrate 106 and have opposite doping types. For example, the first avalanche well 110 may be n-type, whereas the second avalanche well 112 may be p-type, or vice versa. Further, the second avalanche well 112 overlies the first avalanche well 110 and extends from the first avalanche well 110 to the absorption structure 104.

The absorption structure 104 is semiconductive and a different semiconductor material than the semiconductor substrate 106. Further, the absorption structure 104 has a higher absorption coefficient for targeted radiation than the semiconductor substrate 106. In some embodiments, the higher absorption coefficient results from the absorption structure 104 having a smaller bandgap than the semiconductor substrate 106. Because of the higher absorption coefficient, the absorption structure 104 is employed for absorption of radiation incident on the photodetector 102. The absorption structure 104 may, for example, be or comprise germanium, a germanium-tin alloy (e.g., GeSn), or the like, and the semiconductor substrate 106 may, for example, be or comprise silicon or the like, at least when the targeted radiation is long-wavelength radiation.

As used herein, long-wavelength radiation may, for example, be or comprise radiation with a wavelength greater than about 1310 nanometers, about 2000 nanometers, about 3000 nanometers, or some other suitable value and/or may, for example, be or comprise radiation with a radiation of about 1310-3000 nanometers, about 1310-2155 nanometers, about 2155-3000 nanometers, or some other suitable value. Further, the long-wavelength radiation may, for example, be or comprise SWIR radiation or the like.

The absorption structure 104 comprises an inner absorption layer 114 and a peripheral absorption layer 116. The inner absorption layer 114 is recessed into the semiconductor substrate 106 and has a bottom protrusion 114$p$ protruding through the peripheral absorption layer 116 to the second avalanche well 112. The peripheral absorption layer 116 is at an interface between the semiconductor substrate 106 and the absorption structure 104. Further, the peripheral absorption layer 116 is on sidewalls of the inner absorption layer 114 and a bottom of the inner absorption layer 114, and further extends from the sidewalls to the bottom protrusion 114$p$. Hence, the peripheral absorption layer 116 separates the inner absorption layer 114 from the semiconductor substrate 106, except at the bottom protrusion 114$p$. Further, the peripheral absorption layer 116 wraps around a bottom corner of the inner absorption layer 114 to separate the bottom corner from the semiconductor substrate 106.

The inner absorption layer 114 is intrinsic or lightly doped compared to the peripheral absorption layer 116, whereas the peripheral absorption layer 116 is highly doped compared to the inner absorption layer 114. Hence, the inner absorption layer 114 has a smaller doping concentration than the peripheral absorption layer 116. Further, the peripheral absorption layer 116 is doped with dopants having a same doping type as the second avalanche well 112 and an opposite doping type as the first avalanche well 110.

Because the absorption structure 104 is a different semiconductor material than the semiconductor substrate 106, the absorption structure 104 and the semiconductor substrate 106 may have a mismatch of lattice constants, coefficients of thermal expansion, and the like. This may lead to crystalline defects in the absorption structure 104 and/or interface states between the semiconductor substrate 106 and the absorption structure 104. Further, the defects and the interface states may lead to dark current at the interface between the semiconductor substrate 106 and the absorption structure 104. However, because the peripheral absorption layer 116 is highly doped, the peripheral absorption layer 116 is rich in carriers and passivates crystalline defects and interface states at the interface to suppress dark current.

Additionally, as seen hereafter, the peripheral absorption layer 116 allows the photodetector 102 to be formed at reduced complexity compared to other like photodetectors. For example, the photodetector 102 may be formed without a guard ring in the absorption structure 104, thereby saving a photolithography process and an ion implantation process. As another example, the peripheral absorption layer 116 may be formed without ion implantation and may hence be formed without damaging the semiconductor substrate 106. As such, thermal processing to repair the damage and an ion implantation process may be saved.

With continued reference to FIG. 1, the inner absorption layer 114 and the peripheral absorption layer 116 are semiconductive and have a higher absorption coefficient for targeted radiation than the semiconductor substrate 106. In some embodiments, the inner absorption layer 114 and the peripheral absorption layer 116 also have a smaller bandgap than the semiconductor substrate 106. The smaller bandgap enhances absorption of long-wavelength radiation. The smaller bandgap may, for example, be about 0.66 electron volts (eV) or some other suitable value and/or less than about 1 eV, 0.7 eV, or some other suitable value.

In some embodiments, doping aside, the inner absorption layer 114 and the peripheral absorption layer 116 are or comprise a common semiconductor material. For example, the inner absorption layer 114 and the peripheral absorption layer 116 may be or comprise germanium, a germanium-tin alloy, or the like. In alternative embodiments, doping aside, the inner absorption layer 114 and the peripheral absorption layer 116 are or comprise different semiconductor materials. For example, the inner absorption layer 114 may be or comprise germanium or the like, whereas the peripheral absorption layer 116 may be or comprise a germanium-tin alloy or the like, or vice versa. In some embodiments, to the extent that the inner absorption layer 114 is or comprises a germanium-tin alloy and/or the peripheral absorption layer 116 is or comprises a germanium-tin alloy, an atomic percentage of tin atoms is less than about 1% or some other suitable percentage. Compared to germanium, a germanium-tin alloy has higher quantum efficiency because tin has a smaller bandgap than germanium.

In some embodiments, the inner absorption layer 114 and the semiconductor substrate 106 have a lattice mismatch of about 3% or more, about 4% or more, or about some other suitable percentage. For example, the inner absorption layer 114 and the semiconductor substrate 106 may have individual values for a lattice constant and a difference between the individual values may be about 4% or some other suitable percent of the individual values. Further, in some embodiments, the peripheral absorption layer 116 and the semiconductor substrate 106 have a lattice mismatch of about 3% or more, about 4% or more, or about some other suitable percentage.

In some embodiments, the inner absorption layer 114 and the semiconductor substrate 106 have a difference of thermal expansion coefficient of about 50% or more, about 55% or more, or about some other suitable percentage. Further, in some embodiments, the peripheral absorption layer 116 and the semiconductor substrate 106 have a difference of thermal expansion coefficient of about 50% or more, about 55% or more, or about some other suitable percentage.

The inner absorption layer 114 is intrinsic (e.g., undoped) or is otherwise lightly doped with a smaller doping concentration than the peripheral absorption layer 116. In some embodiments, the inner absorption layer 114 has a doping concentration of about 0-5e16 atoms per cubic centimeter (atoms/cm$^3$), about 0-2.5e16 atoms/cm$^3$, about 2.5e16-5e16 atoms/cm$^3$, or some other suitable value. Further, in some embodiments, the peripheral absorption layer 116 has a doping concentration of about 5e16-5e19 atoms/cm$^3$, about 5e16-2.5e19 atoms/cm$^3$, about 2.5e19-5e19 atoms/cm$^3$, or some other suitable value.

The bottom protrusion 114$p$ of the inner absorption layer 114 has a width $W_p$ that decreases to the second avalanche well 112. In some embodiments, the width $W_p$ is about 0.5-2 micrometers, about 0.5-1.25 micrometers, about 1.25-2 micrometers, or some other suitable value. Further, in some embodiments, the bottom protrusion 114$p$ and the second avalanche well 112 have the same width or substantially the same width at an interface at which the bottom protrusion 114$p$ and the second avalanche well 112 directly contact.

The peripheral absorption layer 116 is highly doped as described above. For example, to the extent that the peripheral absorption layer 116 is p-type germanium or the like, the peripheral absorption layer 116 may be doped with boron or the like. Further, the peripheral absorption layer 116 has tapered ends at the second avalanche well 112 and also at top corners of the absorption structure 104. Accordingly, a thickness $T_{pal}$ of the peripheral absorption layer 116 gradually decreases to about zero at each of the tapered ends. Further, the peripheral absorption layer 116 has a slanted surface at each of the tapered ends. The slanted surfaces at the second avalanche well 112 face the bottom protrusion 114$p$, whereas the slanted surfaces at the top corners of the absorption structure 104 face a cap layer 118 atop the absorption structure 104.

In some embodiments, the thickness $T_{pal}$ of the peripheral absorption layer 116 is about 0-500 nanometers, about 0-250 nanometers, about 250-500 nanometers, or some other suitable value. In some embodiments, the thickness $T_{pal}$ is uniform or substantially uniform from bottom corners of the absorption structure 104 to each of the tapered ends. For example, the thickness $T_{pal}$ may have a first uniform thickness value from the bottom corners of the absorption structure 104 to the tapered ends at the top corners of the absorption structure 104. As another example, the thickness $T_{pal}$ may have a second uniform thickness value from the bottom corners of the absorption structure 104 to the tapered ends at the second avalanche well 112. The first uniform thickness value and/or the second uniform thickness value may, for example, be about 50-500 nanometers, about 50-275 nanometers, about 275-500 nanometers, or some other suitable value. Further, while illustrated as being different, the first uniform thickness value and the second uniform thickness value may be the same in alternative embodiments.

The cap layer 118 covers the absorption structure 104 to protect the absorption structure 104 during manufacture of the photodetector 102. The cap layer 118 is semiconductive and a different semiconductor material than the absorption structure 104. Further, the cap layer 118 is intrinsic or is otherwise lightly doped. The light doping may, for example, correspond to a doping concentration that is less than about 5e16 atoms/cm$^3$ or some other suitable value.

In some embodiments, the cap layer 118 has a smaller absorption coefficient for targeted radiation than the absorption structure 104 and/or has a larger bandgap than the absorption structure 104. In some embodiments, the cap layer 118 is or comprises the same semiconductor material as semiconductor substrate 106. In some embodiments, the cap layer 118 has a same absorption coefficient for targeted radiation as the semiconductor substrate 106 and/or has a same bandgap as the semiconductor substrate 106.

In some embodiments, a thickness $T_{cap}$ of the cap layer 118 is about 10-100 nanometers, about 10-55 nanometers, about 55-100 nanometers, or some other suitable value. In some embodiments, the thickness $T_{cap}$ is uniform or substantially uniform.

In some embodiments, the absorption structure 104 is or comprises germanium, a germanium-tin alloy, or the like, whereas the semiconductor substrate 106 and the cap layer 118 are or comprise silicon or the like. Such embodiments may, for example, arise when the photodetector 102 is targeted towards long-wavelength radiation. As above, long-wavelength radiation may, for example, include SWIR radiation or the like and/or may, for example, be radiation with a wavelength greater than about 1310 nanometers or the like.

A vertical connection well 120 is in the semiconductor substrate 106 and has a same doping type as the first avalanche well 110. The vertical connection well 120 extends from the first avalanche well 110 to a top of the semiconductor substrate 106 to provide electrical coupling to the first avalanche well 110 from the top of the semiconductor substrate 106. Further, the vertical connection well 120 surrounds the absorption structure 104 with a pair of segments between which the absorption structure 104 is arranged.

A first contact region 122 is atop the vertical connection well 120 in the semiconductor substrate 106, and a second contact region 124 is in the cap layer 118 and the absorption structure 104. The first contact region 122 has a same doping type as the first avalanche well 110 and the vertical connection well 120, but has a higher doping concentration. Further, the first contact region 122 has a pair of segments respectively on opposite sides of the absorption structure 104. The second contact region 124 has a same doping type as the second avalanche well 112 and as the peripheral absorption layer 116, but has a higher doping concentration. Hence, the second contact region 124 has an opposite doping type as the first contact region 122.

In some embodiments, the bulk of the semiconductor substrate 106 is intrinsic or is lightly doped. The bulk of the semiconductor substrate 106 corresponds to a portion of the semiconductor substrate 106 that surrounds the first avalanche well 110, the second avalanche well 112, the vertical connection well 120, and the first contact region 122. The light doping may, for example, correspond to a doping concentration that is less than about 5e16 atoms/cm$^3$ or some other suitable value. In some embodiments in which the bulk of the semiconductor substrate 106 is lightly doped, the bulk has a same doping type as the second avalanche well 112.

An interconnect structure 126 (partially shown) covers and electrically couples to the photodetector 102. The interconnect structure 126 comprises a plurality of conductive features, including contacts 128 and wires 130. The contacts 128 are in an interlayer dielectric (ILD) layer 132, which separates the wires 130 from the photodetector 102. Further, the contacts 128 extend respectively from the wires 130 respectively to first and second contact regions 122, 124.

During operation of the photodetector 102, one of the first contact region 122 and the second contact region 124 corresponds to an anode of the photodetector 102 and a cathode of the photodetector 102. For example, to the extent that the second contact region 124 is p-type, the second contact region 124 corresponds to the anode and the first contact region 122 corresponds to the cathode. Further, the photodetector 102 is reverse biased through the interconnect structure 126. To the extent that the photodetector 102 is an APD, the photodetector 102 may, for example, be reverse biased slightly below a reverse-breakdown voltage. To the extent that the photodetector 102 is an SPAD, the photodetector 102 may, for example, be reverse biased above the reverse-break down voltage. In some embodiments, the photodetector 102 is reverse biased at hundreds of volts, tens of volts, or some other suitable voltage. For example, the photodetector 102 may be reverse biased at about 0-20 volts, about 10-20 volts, or some other suitable voltage.

While the photodetector 102 is reverse biased, the photodetector 102 is exposed to target radiation (e.g., long-wavelength radiation, SWIR radiation, or the like). The radiation is absorbed at the absorption structure 104 with high quantum efficiency due to its high absorption coefficient. Absorption leads to photo-generated carriers, which migrate to and are accelerated at the avalanche region 108 by a high electric field across the photodetector 102. The photo-generated carriers migrate to the avalanche region 108 via the second avalanche well 112, whereby the second avalanche well 112 may also be regarded as a carrier channel or the like. For example, to the extent that electrons migrate to the avalanche region 108, the second avalanche well 112 may be regarded as an electron channel. At the avalanche region 108, the photo-generated carriers are accelerated to a kinetic energy that overcomes ionization energy of the semiconductor substrate 106 and knocks electrons out of atoms of the semiconductor substrate 106. This leads to an avalanche of current carriers that can be measured.

Figure 2A:
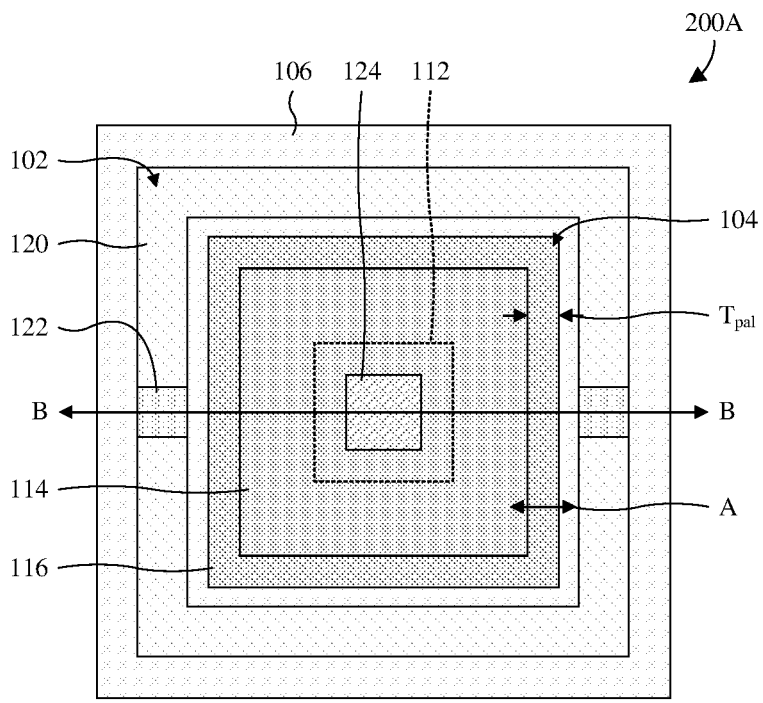
FIGS. 2A and 2B illustrate top layout views of various different embodiments of the sensor device of FIG. 1.
Figure 2B:
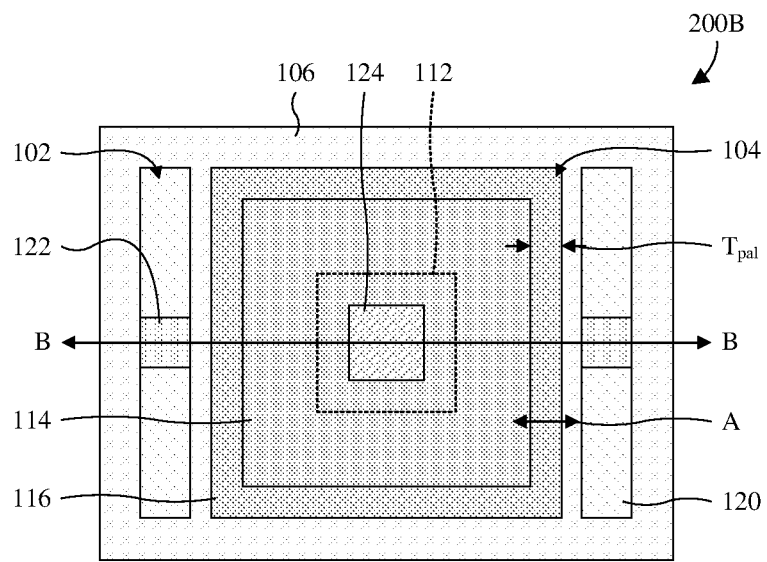

With reference to FIGS. 2A and 2B, top layout views 200A, 200B of various different embodiments of the sensor device of FIG. 1 are provided. The cross-sectional view 100 of FIG. 1 may, for example, be taken along line B in FIGS. 2A and 2B.

In FIG. 2A, the vertical connection well 120 extends in a closed path around the absorption structure 104. Further, the first contact region 122 has a pair of discrete segments respectively on opposite sides of the absorption structure 104 and overlapping with the vertical connection well 120.

In FIG. 2B, the vertical connection well 120 has two discrete segments respectively on opposite sides of the absorption structure 104. Further, the first contact region 122 has two discrete segments respectively on the opposite sides and respectively overlapping with the discrete segments of the vertical connection well 120.

In both FIG. 2A and FIG. 2B, the second contact region 124 and the second avalanche well 112 (shown in phantom) both overlap with the inner absorption layer 114 at a center of the inner absorption layer 114. Additionally, the peripheral absorption layer 116 extends in a closed path around the inner absorption layer 114.

Figure 3A:
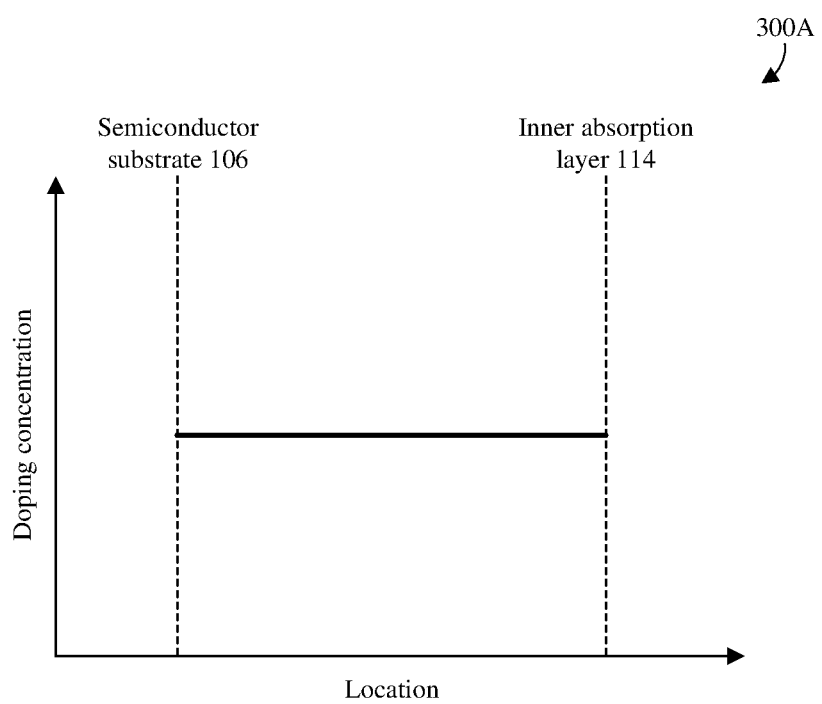
FIGS. 3A-3C illustrate doping profiles for various different embodiments of a peripheral absorption layer in the sensor device of FIG. 1.
Figure 3B:
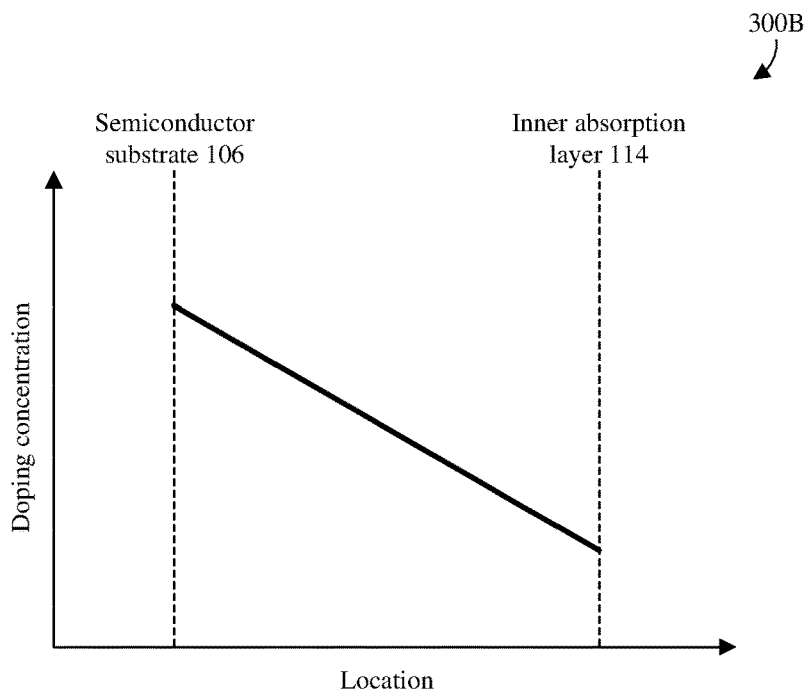
Figure 3C:
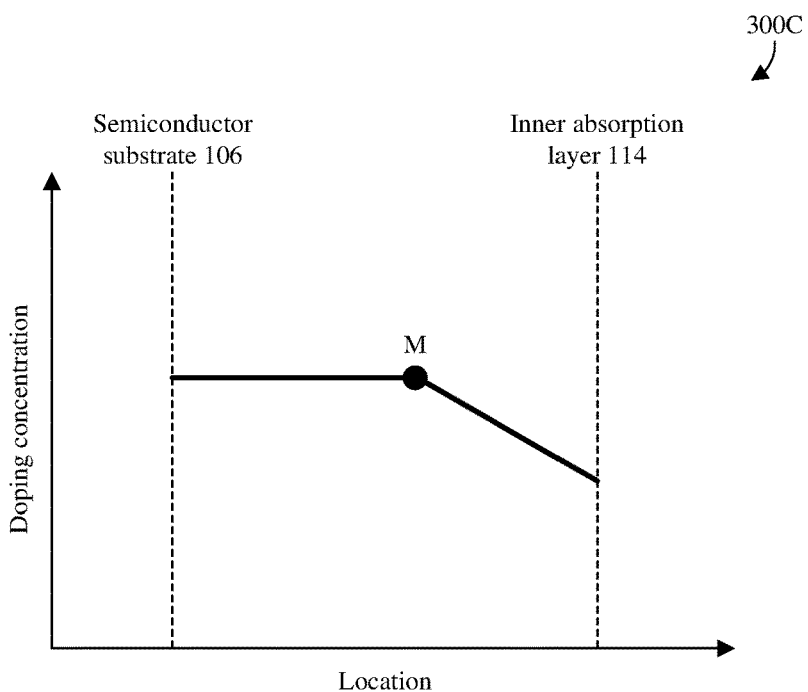

With reference to FIGS. 3A-3C, doping profiles 300A-300C for various different embodiments of the peripheral absorption layer 116 are provided. As noted above, the peripheral absorption layer 116 is highly doped to suppress dark current along an interface between the peripheral absorption layer 116 and the semiconductor substrate 106. The doping profiles 300A-300C extend along the thickness $T_{pal}$ of the peripheral absorption layer 116 and may, for example, be taken along line A in any of FIGS. 1, 2A, and 2B.

In FIG. 3A, a doping concentration of the peripheral absorption layer 116 is uniform from the semiconductor substrate 106 to the inner absorption layer 114. Compared to a variable doping profile, a uniform doping profile may have better process control.

In FIG. 3B, the doping concentration decreases continuously and linearly from the semiconductor substrate 106 to the inner absorption layer 114. Further, the doping concentration decreases to a non-zero value at the inner absorption layer 114. For example, the doping concentration may decrease from about 5e19 atoms/cm$^3$ to about 5e16 atoms/cm$^3$ at the inner absorption layer 114. Other suitable values are, however, amenable. In alternative embodiments, the doping concentration decreases to zero at the inner absorption layer 114. Further, in alternative embodiments, the doping concentration decreases discretely and/or non-linearly from the semiconductor substrate 106 to the inner absorption layer 114. Compared to a uniform doping profile (e.g., as in FIG. 3A), a decreasing doping profile may better reduce dark current at an interface between the absorption structure 104 and the semiconductor substrate 106 and may hence better enhance quantum efficiency of the photodetector 102.

In FIG. 3C, the doping concentration of the peripheral absorption layer 116 is uniform from the semiconductor substrate 106 to a midpoint M, which is midway between the semiconductor substrate 106 and the inner absorption layer 114. Further, the doping concentration decreases continuously and linearly from the midpoint M to the inner absorption layer 114 and has a non-zero value at the inner absorption layer 114. In alternative embodiments, the doping concentration decreases to zero at the inner absorption layer 114. Further, in alternative embodiments, the doping concentration decreases discretely and/or non-linearly from the midpoint M to the inner absorption layer 114.

With reference to FIGS. 4A-4E, cross-sectional views 400A-400E of various different alternative embodiments of the sensor device of FIG. 1 are provided in which constituents of the photodetector 102 (e.g., the peripheral absorption layer 116) are varied.

Figure 4A:
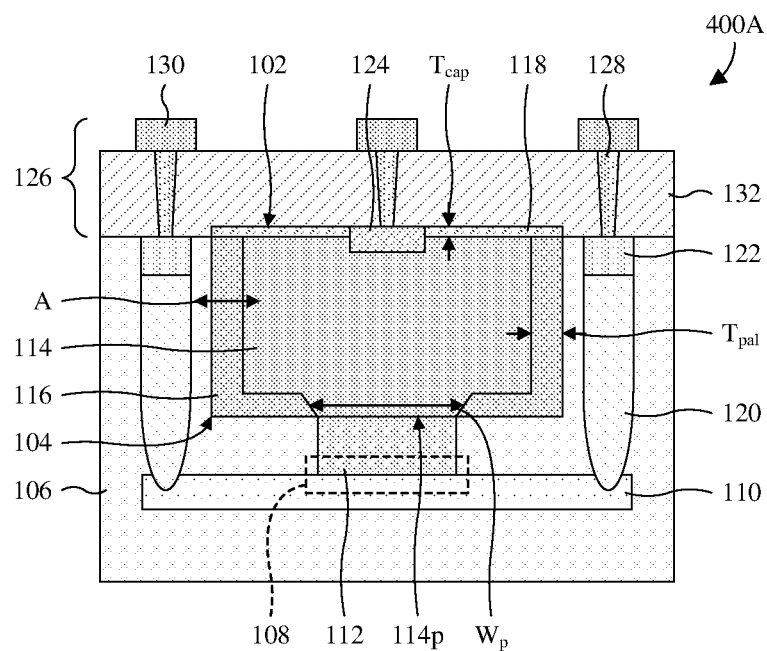
FIGS. 4A-4E illustrate cross-sectional views of various different alternative embodiments of the sensor device of FIG. 1.

In FIG. 4A, the peripheral absorption layer 116 has square ends at the top corners of the absorption structure 104 rather than tapered ends as in FIG. 1. Accordingly, the thickness $T_{pal}$ of the peripheral absorption layer 116 is uniform at the square ends. Further, the peripheral absorption layer 116 has a surface facing the cap layer 118, and extending parallel to a top surface of the semiconductor substrate 106, at each of the square ends. Compared to tapered ends at the top corners, square ends better reduce dark current at the top corners.

Figure 4B:
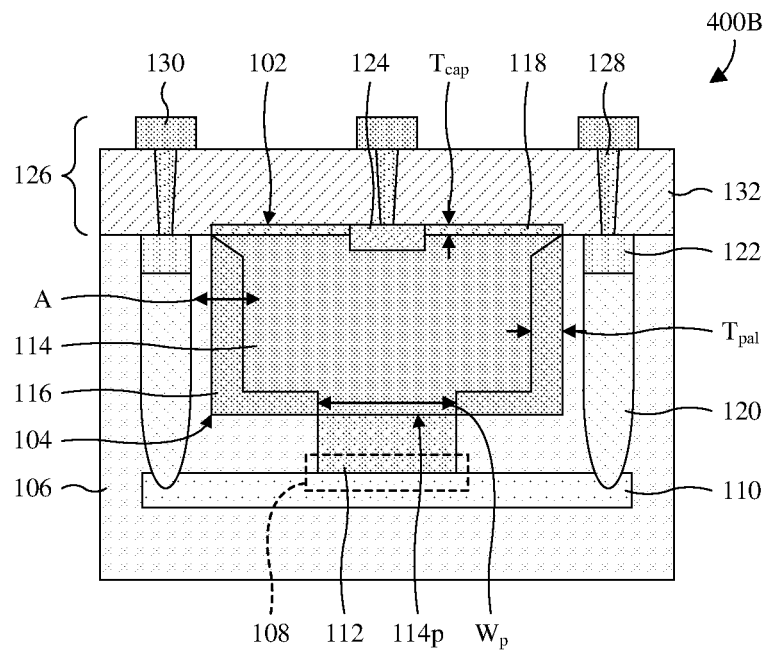

In FIG. 4B, the peripheral absorption layer 116 has square ends at the second avalanche well 112 rather than tapered ends as in FIG. 1. Accordingly, the thickness $T_{pal}$ of the peripheral absorption layer 116 is uniform at the square ends and the width $W_p$ of the bottom protrusion 114p is uniform. Further, the peripheral absorption layer 116 has a surface facing the bottom protrusion 114p, and extending orthogonal to a top surface of the semiconductor substrate 106, at each of the square ends. Compared to tapered ends at the second avalanche well 112, square ends better reduce dark current at the second avalanche well 112.

Figure 4C:
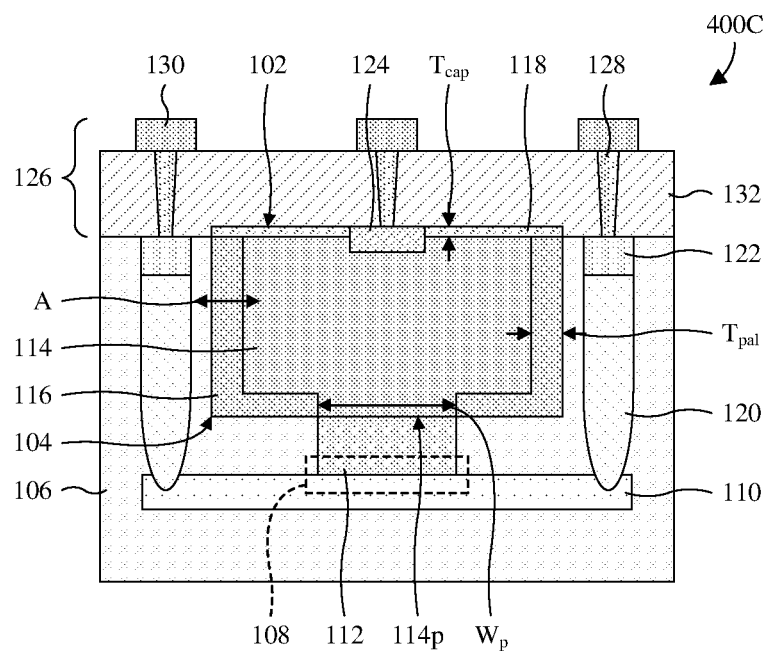

In FIG. 4C, the peripheral absorption layer 116 has square ends at the top corners of the absorption structure 104, as well as at the second avalanche well 112, rather than tapered ends as in FIG. 1. The square ends at the top corners of the absorption structure 104 are as in FIG. 4A, whereas the square ends at the second avalanche well 112 are as in FIG. 4B. Compared to tapered ends, square ends better reduce dark current.

Figure 4D:
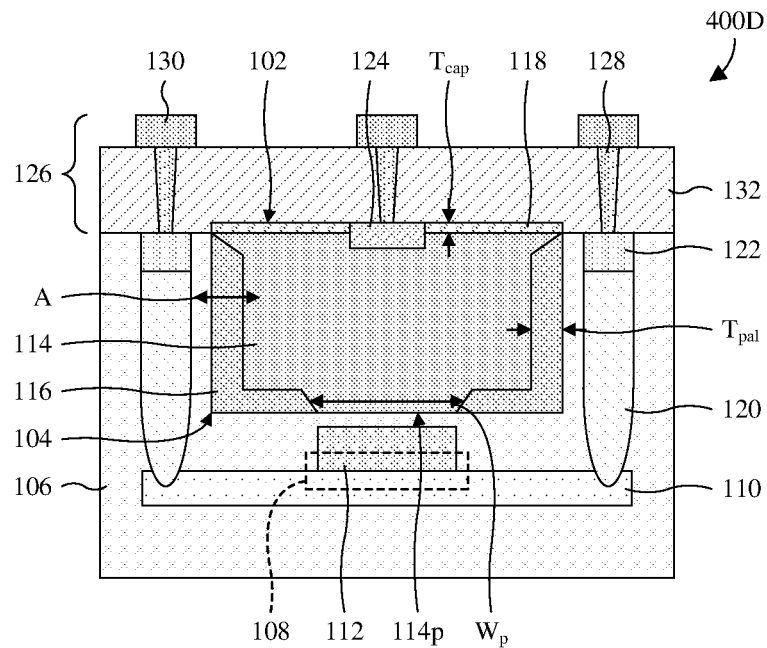

In FIG. 4D, the bottom protrusion 114p is spaced from the second avalanche well 112 by the bulk of the semiconductor substrate 106. As above, the bulk of the semiconductor substrate 106 may be intrinsic or otherwise lightly doped.

Figure 4E:
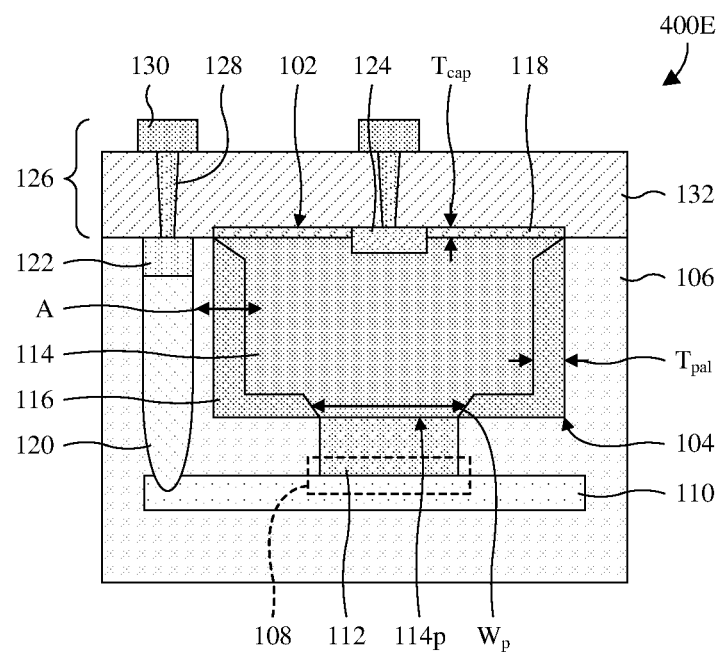

In FIG. 4E, the vertical connection well 120 and the first contact region 122 are localized to a single side of the absorption structure 104.

While FIGS. 2A and 2B are described with regard to the sensor device in FIG. 1, FIGS. 2A and 2B are also applicable to the sensor devices in FIGS. 4A-4D. Hence, the sensor device in any of FIGS. 4A-4D may have a top layout as in any of FIGS. 2A and 2B. While FIGS. 3A-3C are described with regard to the sensor device in FIG. 1, FIGS. 3A-3C are also applicable to the sensor devices in FIGS. 4A-4E. Hence, the peripheral absorption layer 116 in any of FIGS. 4A-4E may have a doping profile as in any of FIGS. 3A-3C.

Figure 5:
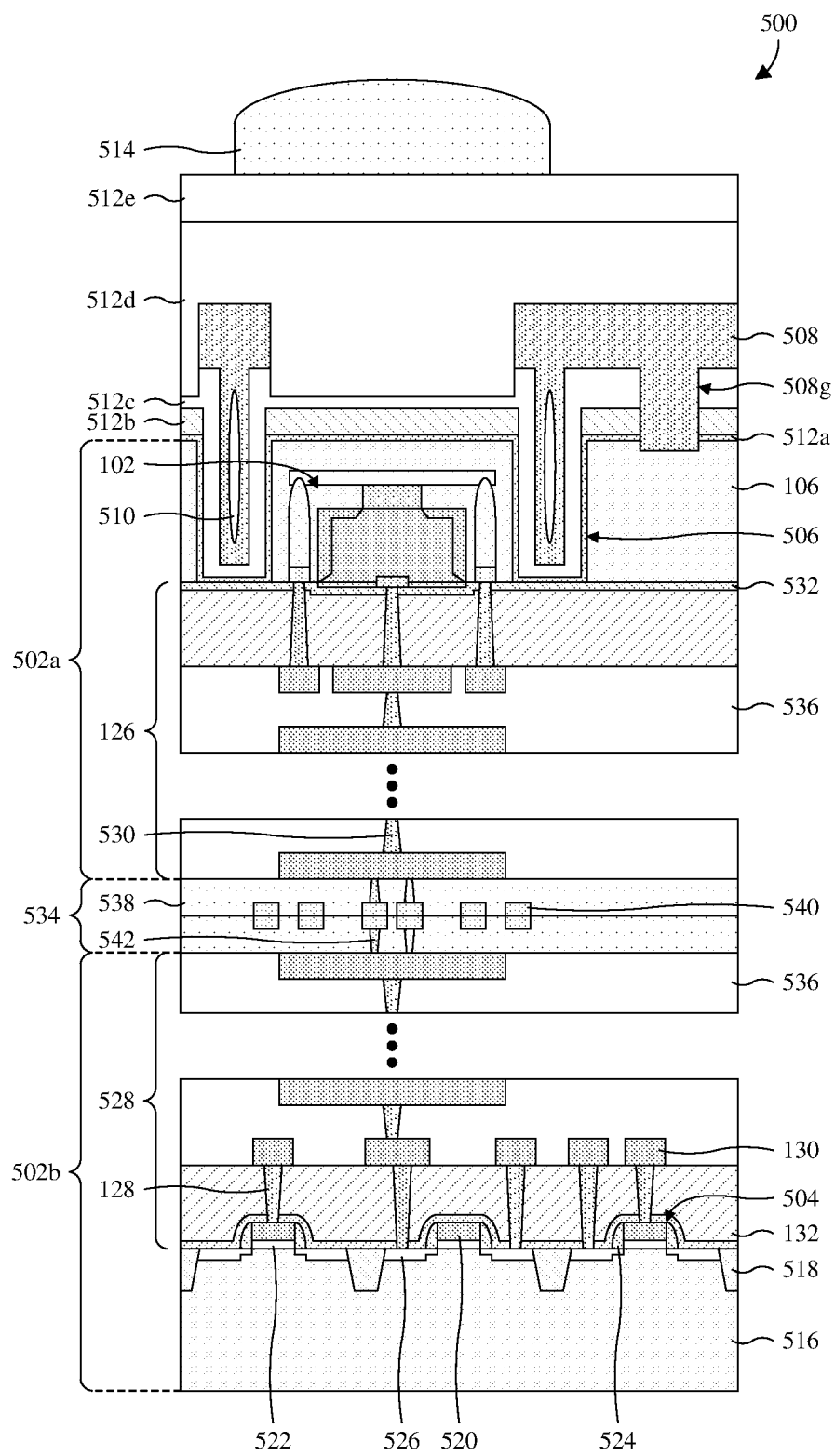
FIG. 5 illustrates a cross-sectional view of some embodiments of the sensor device of FIG. 1 in which the sensor device comprises multiple integrated circuit (IC) chips.

With reference to FIG. 5, a cross-sectional view 500 of some embodiments of the sensor device of FIG. 1 is provided in which the sensor device comprises multiple integrated circuit (IC) chips. The multiple IC chips comprises a first IC chip 502a and a second IC chip 502b underlying and bonded to the first IC chip 502a. The first IC chip 502a accommodates the photodetector 102, whereas the second IC chip 502b accommodates logic devices 504.

The photodetector 102 is on a frontside of a first semiconductor substrate 106, surrounded by a first trench isolation structure 506. Further, the photodetector 102 is as in FIG. 1 but may alternatively be as in any one or combination of FIGS. 2A, 2B, 3A-3C, and 4A-4E. The first trench isolation structure 506 extends through the first semiconductor substrate 106 and has a pair of trench segments between which the photodetector 102 is arranged. The first trench isolation structure 506 provides electrical and optical isolation between the photodetector 102 and neighboring structure (e.g., other photodetectors).

In some embodiments, a thickness of the first semiconductor substrate 106 is about 3 micrometers, about 2.5-3.5 micrometers, about 2.5-3 micrometers, or about 3-3.5 micrometers. Other suitable values are, however, amenable.

A conductive layer 508 overlies the first semiconductor substrate 106, on a backside of the first semiconductor substrate 106. The conductive layer 508 has isolation segments extending through the first semiconductor substrate 106 to partially form the first trench isolation structure 506. The isolation segments are spaced from the first semiconductor substrate 106 and accommodate voids 510, which may also be referred to as air gaps or the like. In alternative embodiments, the voids 510 are omitted. The conductive layer 508 further has a grounding segment 508g extending to the first semiconductor substrate 106. The grounding segment 508g may be employed to ground or otherwise bias the bulk of the first semiconductor substrate 106.

In some embodiments, a thickness of the conductive layer 508 is about 0-5 kilo angstroms, about 0-2.5 kilo angstroms, about 2.5-5 kilo angstroms, or some other suitable value. In some embodiments, the conductive layer 508 is or comprises tungsten, some other suitable metal(s) and/or conductive material(s), or any combination of the foregoing.

A plurality of backside dielectric layers is stacked with the conductive layer 508 on the backside of the first semiconductor substrate 106. The plurality of backside dielectric layers comprises a first backside dielectric layer 512a, a second backside dielectric layer 512b, and a third backside dielectric layer 512c underlying the conductive layer 508. The first and third backside dielectric layers 512a, 512c line the conductive layer at the first trench isolation structure 506 to partially form the first trench isolation structure 506, and the second backside dielectric layer 512b separates the first and third backside dielectric layers 512a, 512c outside the first trench isolation structure 506. The plurality of backside dielectric layers further comprises a fourth backside dielectric layer 512d and a fifth backside dielectric layer 512e overlying the conductive layer 508.

In some embodiments, the first and second backside dielectric layers 512a, 512b are or comprise high k dielectrics, and the third, fourth, and fifth backside dielectric layers 512c-512e are or comprise silicon oxide or the like. The high k dielectrics may, for example, be or comprise hafnium oxide (e.g., $HfO_2$), tantalum oxide (e.g., $Ta_2O_5$), or the like.

In some embodiments, a thickness of the fourth backside dielectric layer 512d is about 3.7-5.7 kilo angstroms, about 3.7-4.7 kilo angstroms, about 4.7-5.7 kilo angstroms, or some other suitable value. In some embodiments, a thickness of the fifth backside dielectric layer 512e is about 1.5-2.5 kilo angstroms, about 1.5-2 kilo angstroms, about 2-2.5 kilo angstroms, or some other suitable value. The third backside dielectric layer 512c has different thicknesses directly over the photodetector 102 and at the grounding segment 508g of the conductive layer 508. In some embodiments, a thickness of the third backside dielectric layer 512c directly over the photodetector 102 is about 0.5-1.5 kilo angstroms, about 0.5-1.0 kilo angstroms, about 1.0-1.5 kilo angstroms, or some other suitable value. In some embodiments, a thickness of the third backside dielectric layer 512c at the grounding segment 508g is about 2-3 kilo angstroms, about 2-2.5 kilo angstroms, about 2.5-3 kilo angstroms, or some other suitable value.

A micro lens 514 directly overlies the photodetector 102 on the plurality of backside dielectric layers. The micro lens 514 is configured to focus radiation on the photodetector 102 to enhance quantum efficiency. In alternative embodiments, a color filter (not shown) is inset into the plurality of backside dielectric layers, between the micro lens 514 and the photodetector 102, to selectively pass targeted radiation. For example, the color filter may pass long-wavelength radiation while blocking other wavelengths of radiation.

The logic devices 504 are on a frontside of a second semiconductor substrate 516 and are separated from each other by a second trench isolation structure 518. The second trench isolation structure 518 is or comprises dielectric material and may, for example, be a shallow trench isolation (STI) structure and/or the like. The logic devices 504 may, for example, be or comprise metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing.

The logic devices 504 comprise individual gate electrodes 520, individual gate dielectric layers 522, individual sidewall spacers 524, and individual pairs of source/drain regions 526. The gate electrodes 520 are stacked respectively with the gate dielectric layers 522, which separate the gate electrodes 520 from the second semiconductor substrate 516. The sidewall spacers 524 are respectively on sidewalls of the gate electrodes 520 and sidewalls of the gate dielectric layers 522. The sidewall spacers 524 are dielectric and may, for example, be or comprise silicon nitride, the like, or any combination of the foregoing. The pairs of source/drain regions 526 are in the second semiconductor substrate 516, and the gate electrodes 520 are each between the source/drain regions of a corresponding pair of source/drain regions 526.

With continued reference to the sensor device of FIG. 5, the first and second IC chips 502a, 502b respectively comprise a first interconnect structure 126 and a second interconnect structure 528. The first and second interconnect structures 126, 528 are between the first semiconductor substrate 106 and the second semiconductor substrate 516. The first interconnect structure 126 is on the frontside of the first semiconductor substrate 106 and electrically couples to the photodetector 102. The second interconnect structure 528 is on the frontside of the second semiconductor substrate 516 and electrically couples to the logic devices 504.

The first and second interconnect structures 126, 528 each comprise a level of contacts 128, a plurality of levels of wires 130, and a plurality of levels of vias 530. The contacts 128 of the first IC chip 502a extend from the photodetector 102, whereas the contacts 128 of the second IC chip 502b extend from the logic devices 504. Further, the contacts 128 are in corresponding ILD layers 132 and contact etch stop layers (CESLs) 532. The wires 130 and the vias 530 are alternatingly stacked from corresponding contacts 128 to a bond structure 534 between the first and second interconnect structures 126, 528. Further, the wires 130 and the vias 530 are in corresponding interconnect dielectric layers 536.

The bond structure 534 facilitates bonding of the first and second IC chips 502a, 502b together through a combination of metal-to-metal bonding and dielectric-to-dielectric bonding. The bond structure 534 comprise bond dielectric layers 538 individual to the first and second IC chips 502a, 502b and directly contacting at a bond interface. Further, the bond structure 534 comprise bond pads 540 individual to the first and second IC chips 502a, 502b and directly contacting at the bond interface. The bond pads 540 are inset respectively into the bond dielectric layers 538 and are electrically coupled respectively to the first and second interconnect structures 126, 528 by bond vias 542 respectively in the bond dielectric layers 538.

Figure 6A:
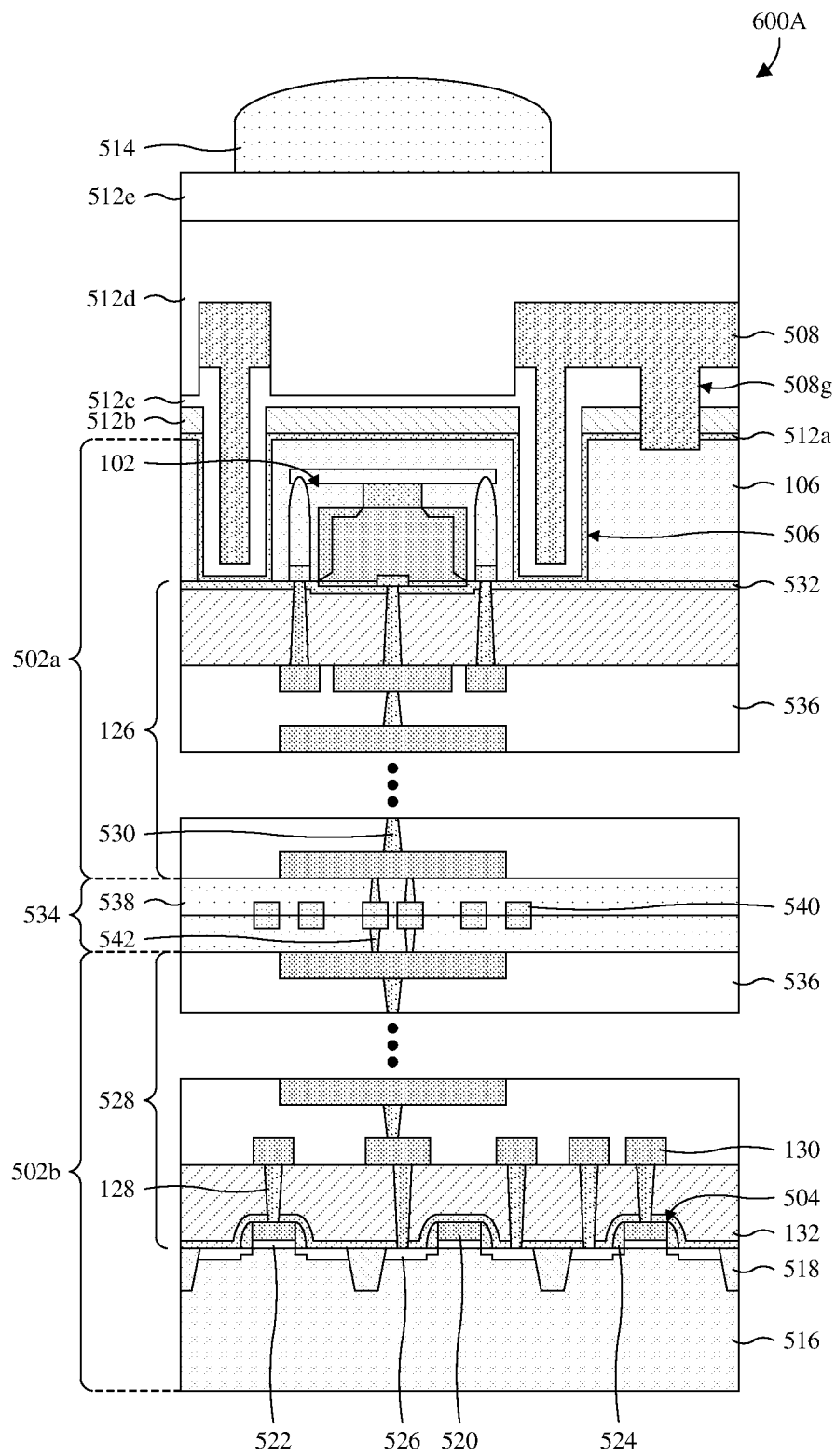
FIGS. 6A and 6B illustrate cross-sectional views of various different alternative embodiments of the sensor device of FIG. 5.
Figure 6B:
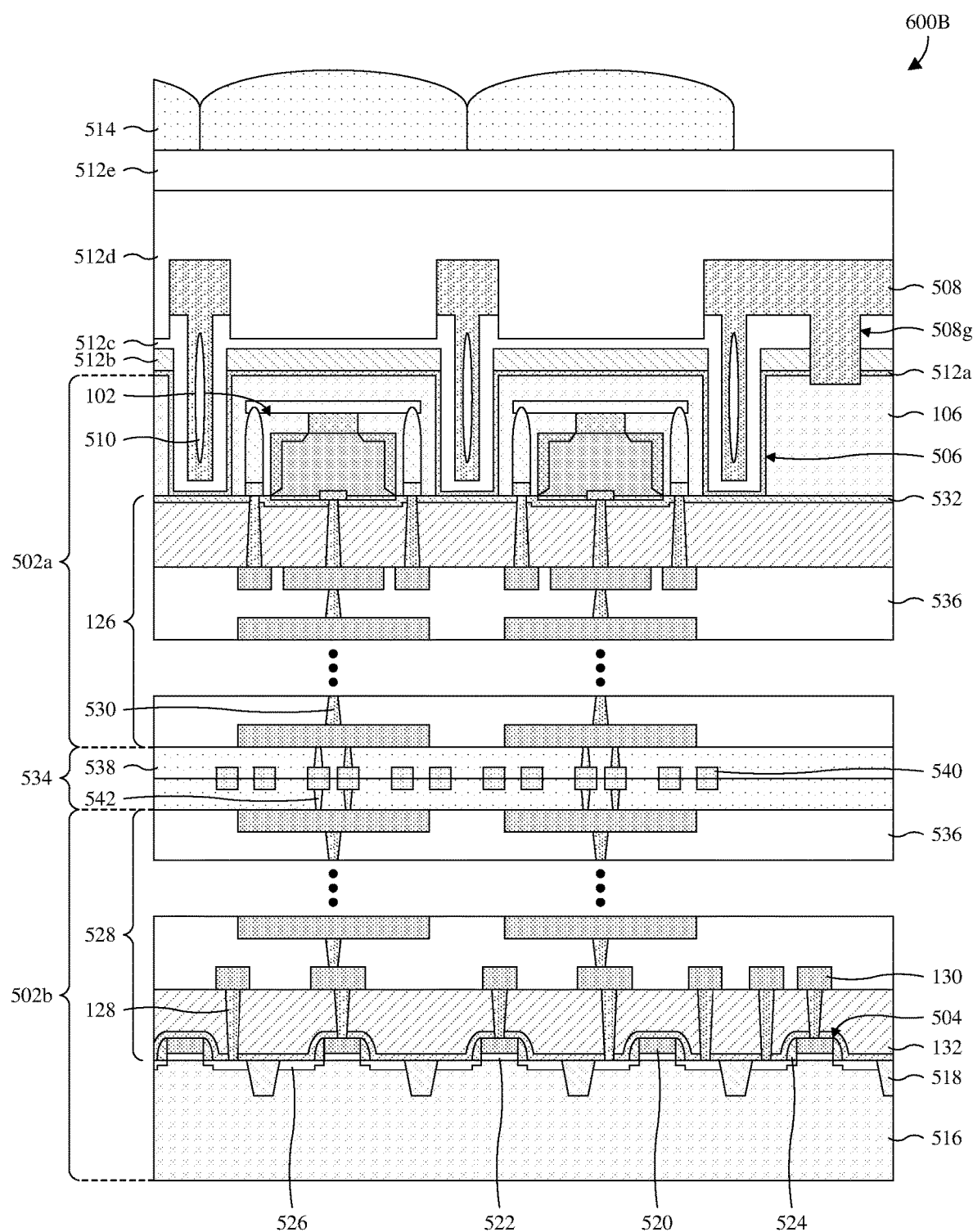

With reference to FIGS. 6A and 6B, cross-sectional views 600A, 600B of various different alternative embodiments of the sensor device of FIG. 5 are provided.

In FIG. 6A, the voids 510 at the first trench isolation structure 506 are omitted. In alternative embodiment, the photodetector 102 is as in any one or combination of FIGS. 2A, 2B, 3A-3C, and 4A-4E.

In FIG. 6B, the sensor device comprises a plurality of photodetectors 102 each as their counterpart is illustrated and described in FIG. 5. In alternative embodiment, the voids 510 are omitted as in FIG. 6A and/or the photodetectors 102 are as in any one or combination of FIGS. 2A, 2B, 3A-3C, and 4A-4E.

Figure 7:
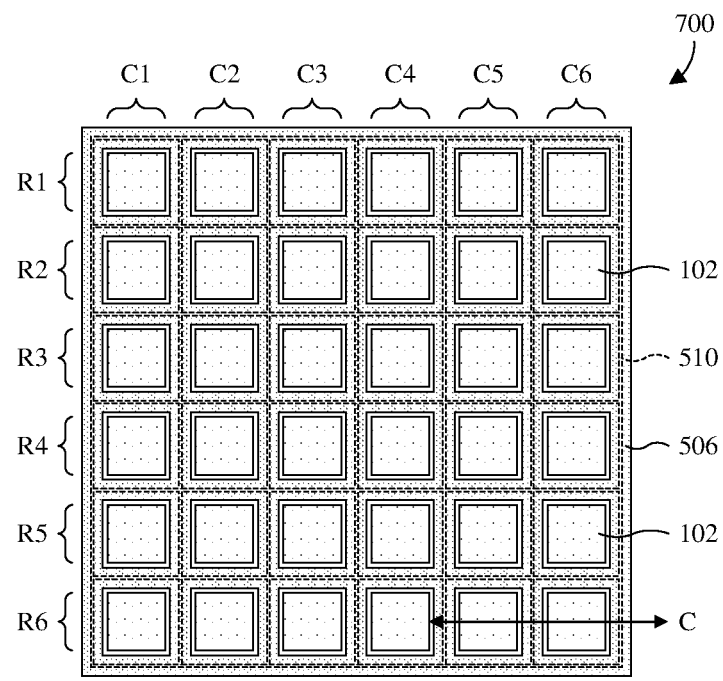
FIG. 7 illustrates a top layout view of some embodiments of the sensor device of FIG. 6B.

With reference to FIG. 7, a top layout view 700 of some embodiments of the sensor device of FIG. 6B is provided. The cross-sectional view 600B of FIG. 6B may, for example, be taken along line C. The sensor device comprises a plurality of photodetectors 102 arranged in a plurality of rows R1-R6 and a plurality of columns C1-C6. While six rows and six columns are illustrated, more or less rows and/or more or less columns are amenable. The photodetectors 102 may individually be as anyone or combination of FIGS. 1, 2A, 2B, 3A-3C, and 4A-4E.

The first trench isolation structure 506 has a grid-shaped layout individually surrounding the photodetectors 102 to separate the photodetectors 102. Further, the first trench isolation structure 506 has a void 510 (shown in phantom). In alternative embodiments, the first trench isolation structure 506 has an alternative layout and/or the void 510 is omitted.

With reference to FIGS. 8-26, a series of cross-sectional views 800-2600 of some embodiments of a method for forming a sensor device comprising a photodetector according to aspects of the present disclosure is provided. The sensor device may, for example, correspond to the sensor device of FIG. 1 or some other suitable sensor device.

Figure 8:
FIGS. 8-26 illustrate a series of cross-sectional views of some embodiments of a method for forming a sensor device comprising a photodetector according to aspects of the present disclosure.

As illustrated by the cross-sectional view 800 of FIG. 8, a first sacrificial layer 802 is deposited on a base substrate 804. The first sacrificial layer 802 is dielectric and may, for example, be or comprise silicon oxide and/or some other suitable dielectric material. Further, the first sacrificial layer 802 may, for example, be deposited by thermal oxidation, vapor deposition, some other suitable deposition process, or any combination of the foregoing.

The base substrate 804 is semiconductive and may, for example, be a bulk silicon substrate or some other suitable type of substrate. Further, the base substrate 804 is intrinsic or lightly doped. The light doping may, for example, correspond to a doping concentration that is less than about 5e16 atoms/cm$^3$ or some other suitable value.

Figure 9:
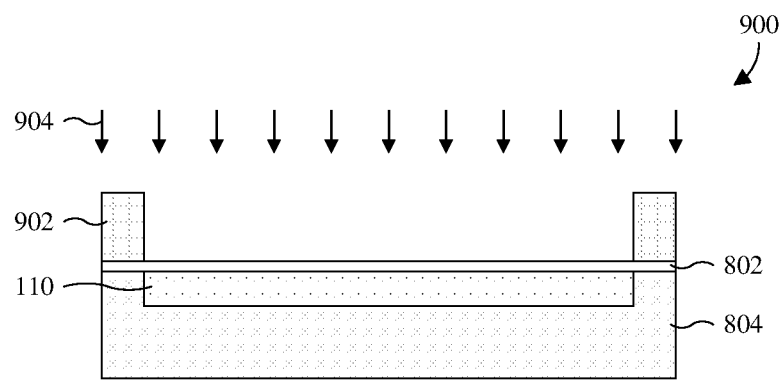

As illustrated by the cross-sectional view 900 of FIG. 9, the base substrate 804 is selectively doped through the first sacrificial layer 802 to form a first avalanche well 110 in the base substrate 804, along a top of the base substrate 804. In some embodiments, a process for performing the selective doping comprises: 1) forming a first mask 902 on the first sacrificial layer 802 using photolithography; 2) performing ion implantation 904 into the base substrate 804 with the first mask 902 in place; and 3) removing the first mask 902. In alternative embodiments, the selective doping is performed by some other suitable process. The first mask 902 may, for example, be or comprise photoresist or some or suitable material.

Figure 10:
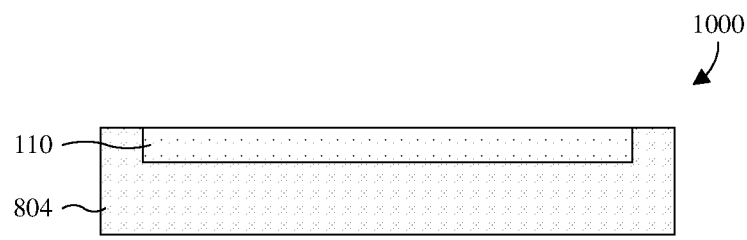

As illustrated by the cross-sectional view 1000 of FIG. 10, the first sacrificial layer 802 is removed, thereby exposing the base substrate 804. The removal may, for example, be performed by an etching process and/or some other suitable type of removal process.

Figure 11:
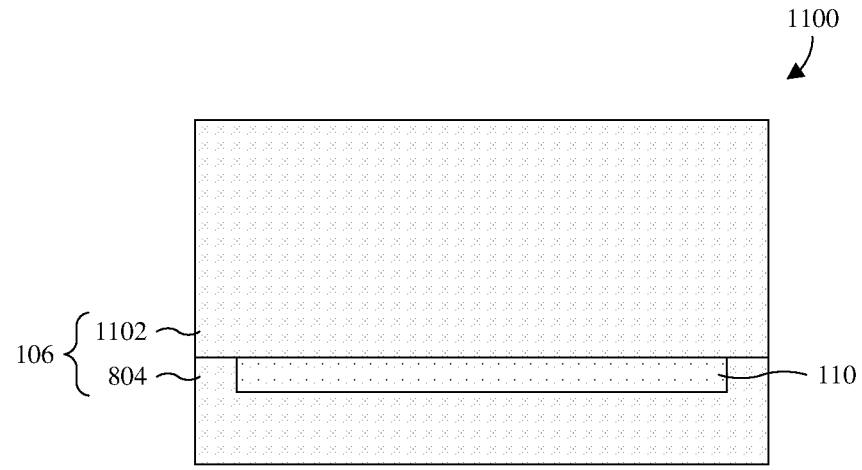

As illustrated by the cross-sectional view 1100 of FIG. 11, a semiconductor layer 1102 is epitaxially deposited on the base substrate 804. Collectively, the base substrate 804 and the semiconductor layer 1102 form a semiconductor substrate 106. The semiconductor layer 1102 may, for example, be or comprise silicon and/or some other suitable material. In some embodiments, the semiconductor layer 1102 is a same material as the base substrate 804. For example, the semiconductor layer 1102 and the base substrate 804 may both be silicon. Further, the semiconductor layer 1102 is intrinsic or lightly doped. The light doping may, for example, correspond to a doping concentration less than about 5e16 atoms/cm$^3$ or some other suitable value.

Figure 12:
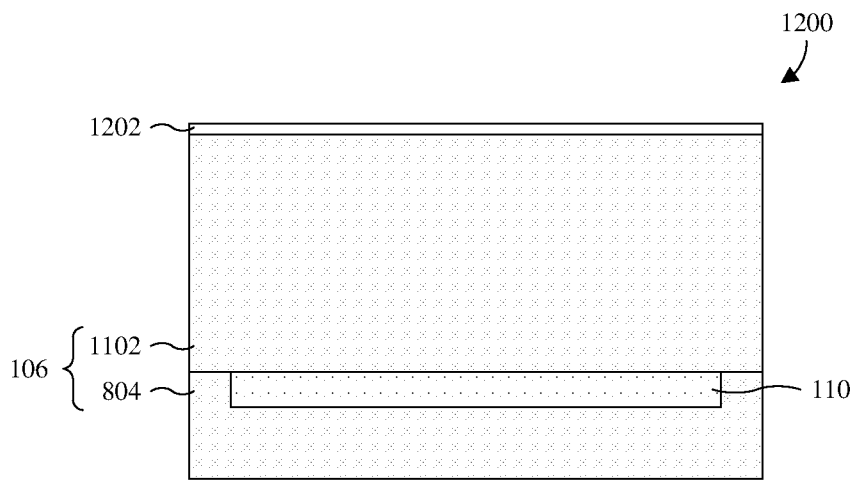

As illustrated by the cross-sectional view 1200 of FIG. 12, a second sacrificial layer 1202 is deposited on the semiconductor substrate 106. The second sacrificial layer 1202 is dielectric and may, for example, be or comprise silicon oxide and/or some other suitable dielectric material. Further, the second sacrificial layer 1202 may, for example, be deposited by thermal oxidation, chemical vapor deposition (CVD), physical vapor deposition (PVD), some other suitable deposition process, or any combination of the foregoing.

Figure 13:
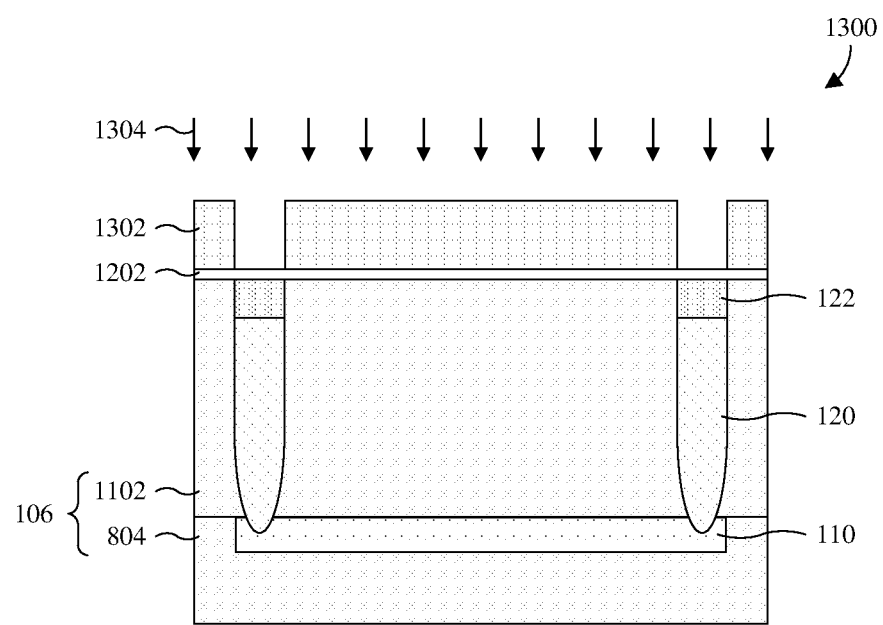

As illustrated by the cross-sectional view 1300 of FIG. 13, the semiconductor substrate 106 is selectively doped through the second sacrificial layer 1202 to form a vertical connection well 120 and a first contact region 122. The vertical connection well 120 has a pair of segments respectively on opposite ends of the first avalanche well 110 and each segment extends from the first avalanche well 110 to a top of the semiconductor substrate 106. The first contact region 122 has a pair of segments respectively overlying the segments of the vertical connection well 120. The vertical connection well 120 and the first contact region 122 have a same doping type as the first avalanche well 110, but the first contact region 122 has a higher doping concentration than the vertical connection well 120 and the first avalanche well 110.

In some embodiments, the vertical connection well 120 and the first contact region 122 have top geometries as in FIG. 2A. In other embodiments, the vertical connection well 120 and the first contact region 122 have top geometries as in FIG. 2B. In yet other embodiments, the vertical connection well 120 has some other suitable top geometry and/or the first contact region 122 has some other suitable top geometry.

In some embodiments, a process for performing the selective doping comprises: 1) forming a second mask 1302 on the second sacrificial layer 1202 using photolithography; 2) performing ion implantation 1304 into the semiconductor substrate 106 with the second mask 1302 in place; and 3) removing the second mask 1302. In alternative embodiments, the selective doping is performed by some other suitable process. The second mask 1302 may, for example, be or comprise photoresist or some or suitable material.

Figure 14:
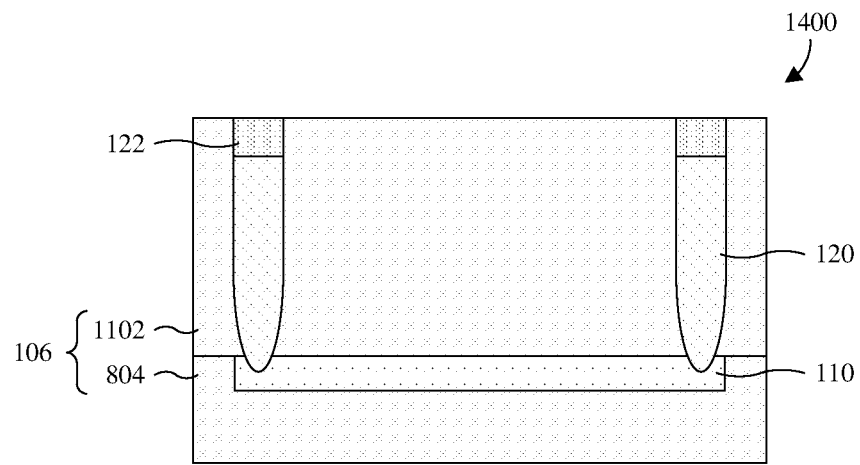

As illustrated by the cross-sectional view 1400 of FIG. 14, the second sacrificial layer 1202 is removed, thereby exposing the semiconductor substrate 106. The removal may, for example, be performed by an etching process and/or some other suitable type of removal process.

Figure 15:
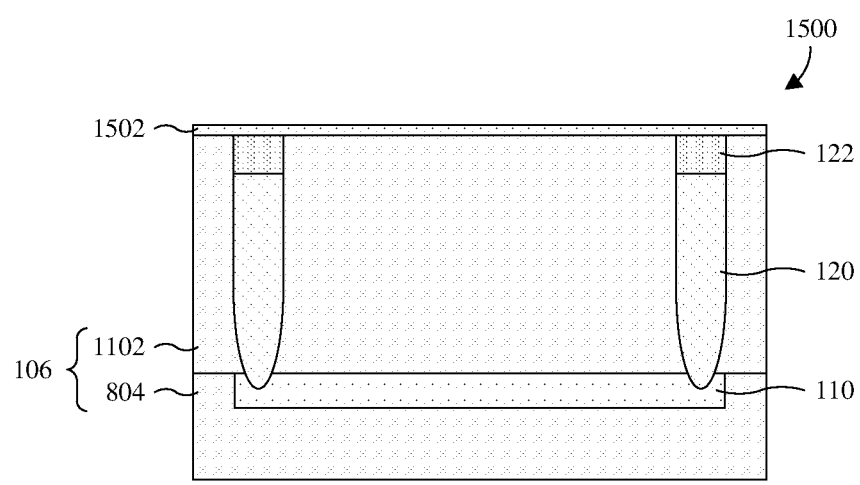

As illustrated by the cross-sectional view 1500 of FIG. 15, a hard mask layer 1502 is deposited on the semiconductor substrate 106. The hard mask layer 1502 is dielectric and may, for example, be or comprise silicon oxide and/or some other suitable dielectric material. Further, the hard mask layer 1502 may, for example, be deposited by thermal oxidation, CVD, PVD, some other suitable deposition process, or any combination of the foregoing.

Figure 16:
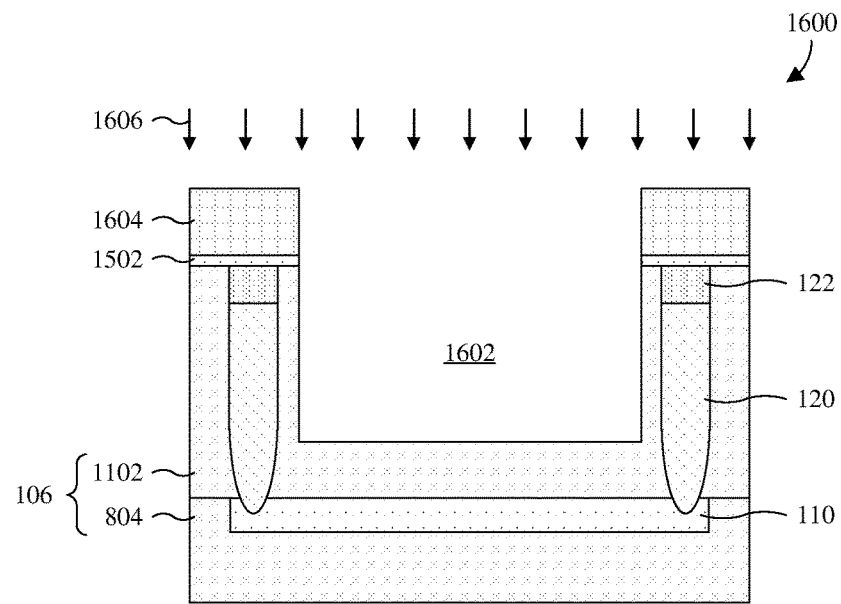

As illustrated by the cross-sectional view 1600 of FIG. 16, the hard mask layer 1502 and the semiconductor substrate 106 are selectively etched to form a trench 1602. The trench 1602 is formed at an area surrounded by the vertical connection well 120 and the first contact region 122. For example, the trench 1602 is between segments of the vertical connection well 120, which are on opposite ends of the first avalanche well 110. Further, the trench 1602 is formed overlying and spaced from the first avalanche well 110.

In some embodiments, a process for performing the selective etching comprises: 1) forming a third mask 1604 on the hard mask layer 1502 using photolithography; 2) performing an etch 1606 into hard mask layer 1502 and the semiconductor substrate 106 with the third mask 1604 in place; and 3) removing the third mask 1604. In alternative embodiments, the selective etching is performed by some other suitable process. The third mask 1604 may, for example, be or comprise photoresist or some or suitable material.

Figure 17:
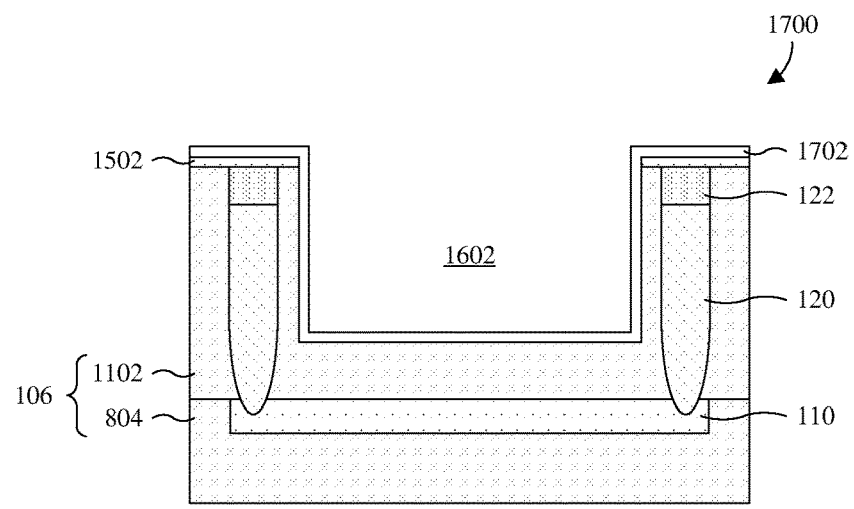

As illustrated by the cross-sectional view 1700 of FIG. 17, a third sacrificial layer 1702 is deposited lining the trench 1602. The third sacrificial layer 1702 is dielectric and may, for example, be or comprise silicon oxide and/or some other suitable dielectric material. Further, the third sacrificial layer 1702 may, for example, be deposited by thermal oxidation, CVD, PVD, some other suitable deposition process, or any combination of the foregoing.

Figure 18:
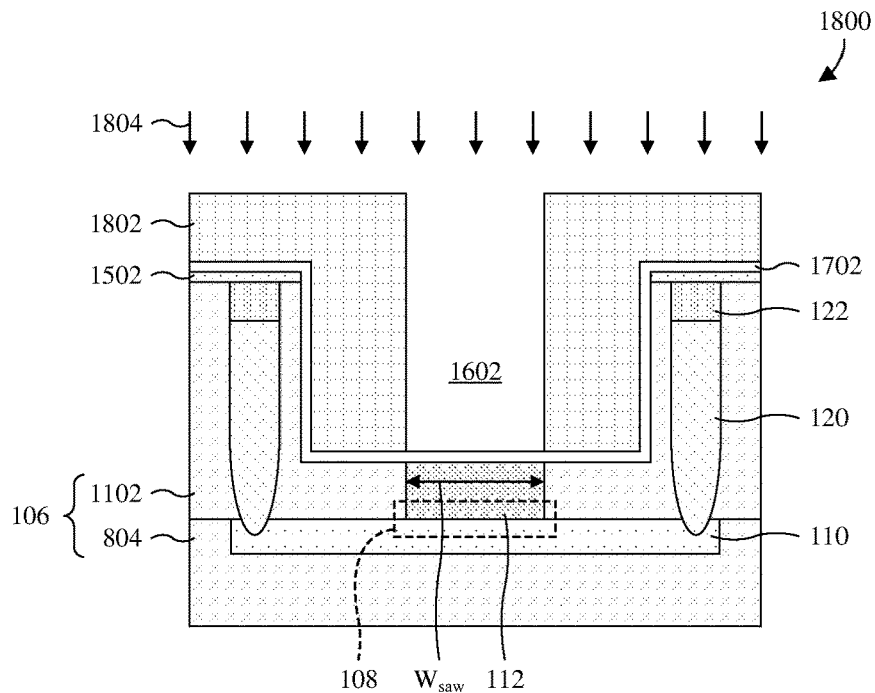

As illustrated by the cross-sectional view 1800 of FIG. 18, the semiconductor substrate 106 is selectively doped through the third sacrificial layer 1702 and the trench 1602 to form a second avalanche well 112. The second avalanche well 112 overlies and is directly on the first avalanche well 110. Further, the second avalanche well 112 has an opposite doping type as the first avalanche well 110. For example, the second avalanche well 112 may be p-type, whereas the first avalanche well may be n-type, or vice versa. Accordingly, the first and second avalanche wells 110, 112 form a PN junction. A width $W_{saw}$ of the second avalanche well 112 is less than a width of the trench 1602 and may, for example, be about 0.5-2 micrometers, about 0.5-1.25 micrometers, about 1.25-2 micrometers, or some other suitable value.

Collectively, the first and second avalanche wells 110, 112 form and avalanche region 108. The avalanche region 108 corresponds to a region at which photo-generated carriers from an absorption structure hereafter formed are multiplied by the avalanche effect. Hence, the avalanche, region 108 may also be referred to as a multiplication region or the like.

In some embodiments, a process for performing the selective doping comprises: 1) forming a fourth mask 1802 on the third sacrificial layer 1702 using photolithography; 2) performing ion implantation 1804 into the semiconductor substrate 106 with the fourth mask 1802 in place; and 3) removing the fourth mask 1802. In alternative embodiments, the selective doping is performed by some other suitable process. The fourth mask 1802 may, for example, be or comprise photoresist or some or suitable material.

Figure 19:
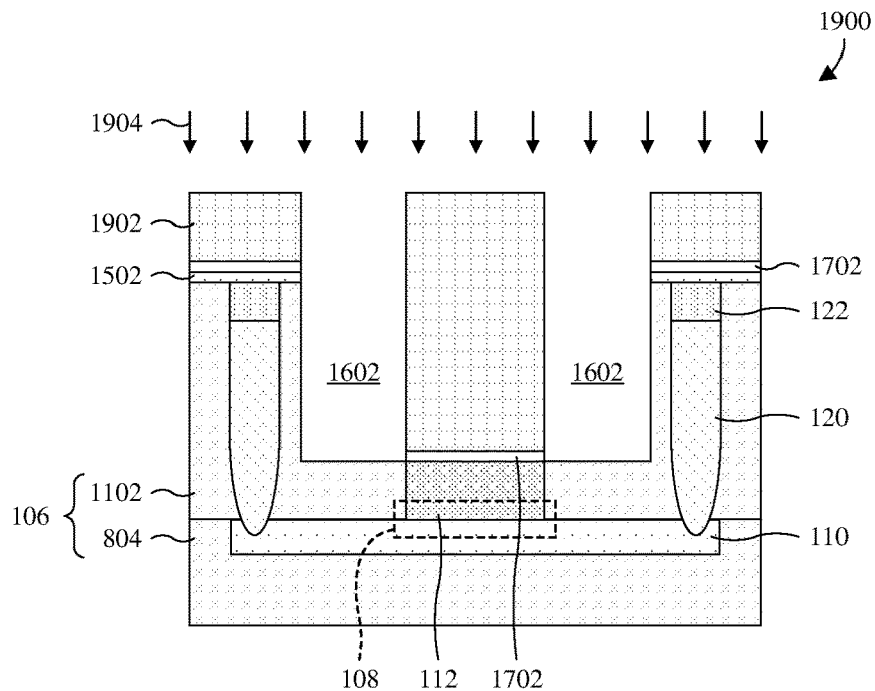

As illustrated by the cross-sectional view 1900 of FIG. 19, the third sacrificial layer 1702 is selectively etched to clear the third sacrificial layer 1702 from the trench 1602, except at the second avalanche well 112. As a result, sidewalls of the semiconductor substrate 106 that are in the trench 1602 are cleared of the third sacrificial layer 1702. Further, a recessed surface of the semiconductor substrate 106 that is in the trench 1602 is partially cleared of the third sacrificial layer 1702 at locations laterally offset from the second avalanche well 112.

In some embodiments, a process for performing the selective etching comprises: 1) forming a fifth mask 1902 on the third sacrificial layer 1702 using photolithography; 2) performing an etch 1904 into the third sacrificial layer 1702 with the fifth mask 1902 in place; and 3) removing the fifth mask 1902. In alternative embodiments, the selective etching is performed by some other suitable process. The fifth mask 1902 may, for example, be or comprise photoresist or some or suitable material.

Figure 20:
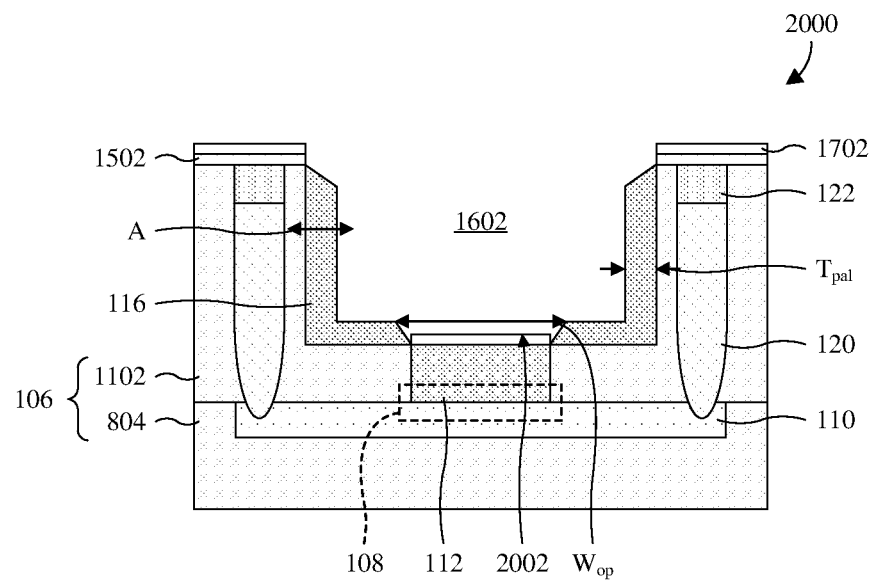

As illustrated by the cross-sectional view 2000 of FIG. 20, a peripheral absorption layer 116 is epitaxially grown with the third sacrificial layer 1702 in place. The peripheral absorption layer 116 preferentially grows on semiconductor surfaces, rather than dielectric surfaces. As such, the peripheral absorption layer 116 grows on sidewalls of the semiconductor substrate 106 that are in the trench 1602. Further, the peripheral absorption layer 116 grows on the recessed surface of the semiconductor substrate 106 that is in the trench 1602, except at the second avalanche well 112 where masked by the third sacrificial layer 1702.

Because the peripheral absorption layer 116 preferentially grows on semiconductor surfaces, the peripheral absorption layer 116 is deposited by a self-aligned process. Further, because the peripheral absorption layer 116 does not grow at the second avalanche well 112, the peripheral absorption layer 116 has an opening 2002 overlying the peripheral absorption layer 116. In some embodiments, a width $W_{op}$ of the opening 2002 is about 0.5-2 micrometers, about 0.5-1.25 micrometers, about 1.25-2 micrometers, or some other suitable value.

The peripheral absorption layer 116 further grows with tapered ends at the second avalanche well 112 and also at a top of the semiconductor substrate 106. Accordingly, the peripheral absorption layer 116 has a slanted surface at each of the tapered ends and further has a thickness $T_{pal}$ that gradually decreases to about zero at each of the tapered ends. In some embodiments, between the tapered ends, the thickness $T_{pal}$ is about 50-500 nanometers, about 50-275 nanometers, about 275-500 nanometers, or some other suitable value.

The peripheral absorption layer 116 is semiconductive and has a different semiconductor material than the semiconductor substrate 106. Further, the peripheral absorption layer 116 has a higher absorption coefficient for targeted radiation than the semiconductor substrate 106 and, in some embodiments, has a smaller bandgap than the semiconductor substrate 106. The peripheral absorption layer 116 may, for example, be or comprise germanium, a germanium-tin alloy (e.g., GeSn), or the like, and the semiconductor substrate 106 may, for example, be or comprise silicon or the like, when the targeted radiation is long-wavelength radiation. Compared to germanium, a germanium-tin alloy has higher quantum efficiency because tin has a smaller bandgap than germanium. Long-wavelength radiation may, for example, be or comprise radiation with a wavelength greater than about 1310 nanometers or some other suitable value.

The peripheral absorption layer 116 is doped with dopants having a same doping type as the second avalanche well 112 and an opposite doping type as the first avalanche well 110. For example, to the extent that the second avalanche well 112 has a p-type doping, the peripheral absorption layer 116 may also have a p-type doping. In some embodiments in which the peripheral absorption 116 has a p-type doping and is or comprises germanium, the dopants may be or comprise boron or some other suitable dopant. In some embodiments, the peripheral absorption layer 116 has a high doping concentration, which is about 5e16-5e19 atoms/$cm^3$, about 5e16-2.5e19 atoms/$cm^3$, about 2.5e19-5e19 atoms/$cm^3$, or some other suitable value and/or which is greater than about 5e16-5e19 atoms/$cm^3$, about 5e16-2.5e19 atoms/$cm^3$, about 2.5e19-5e19 atoms/$cm^3$, or some other suitable value. In some embodiments, the peripheral absorption layer 116 has a doping profile as in any of FIGS. 3A-3C. The doping profile may, for example, correspond to line A in FIG. 20.

The peripheral absorption layer 116 may, for example, be epitaxially grown by molecular beam epitaxy (MBE), CVD, or some other suitable process. In some embodiments in which the peripheral absorption layer 116 is or comprises p-type germanium, the epitaxial growth is performed by a CVD process with: 1) germane (e.g., $GeH_4$) and diborane (e.g., $B_2H_4$) precursors; 2) a temperature of about 350-700 degrees Celsius; and 3) a pressure of about 5-50 torr. In such embodiments, the ratio of germane and diborane may be adjusted to control the doping profile. For example, increasing a flow rate of diborane may increase doping concentration. In some embodiments in which the peripheral absorption layer 116 is or comprises a germanium-tin alloy, the epitaxial growth is performed by the CVD process as above except for an additional tin chloride (e.g., $SnCl_4$) precursor. In such embodiments, a ratio of the precursors may be adjusted to limit an atomic percentage of tin to less than 1% or some other suitable value. For example, decreasing a flow rate of tin chloride may reduce the atomic percentage. While the CVD process describes specific precursors, temperatures, and pressures, other suitable precursors, temperatures, and pressures are amenable in alternative embodiments.

Figure 21:
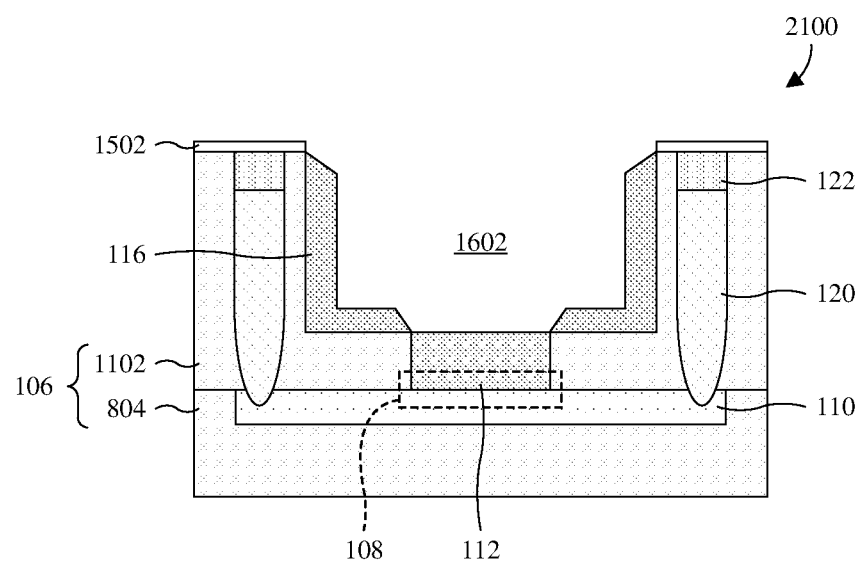

As illustrated by the cross-sectional view 2100 of FIG. 21, the third sacrificial layer 1702 is removed, thereby exposing the hard mask layer 1502 and the second avalanche well 112. The removal may, for example, be performed by an etching process and/or some other suitable type of removal process.

Figure 22:
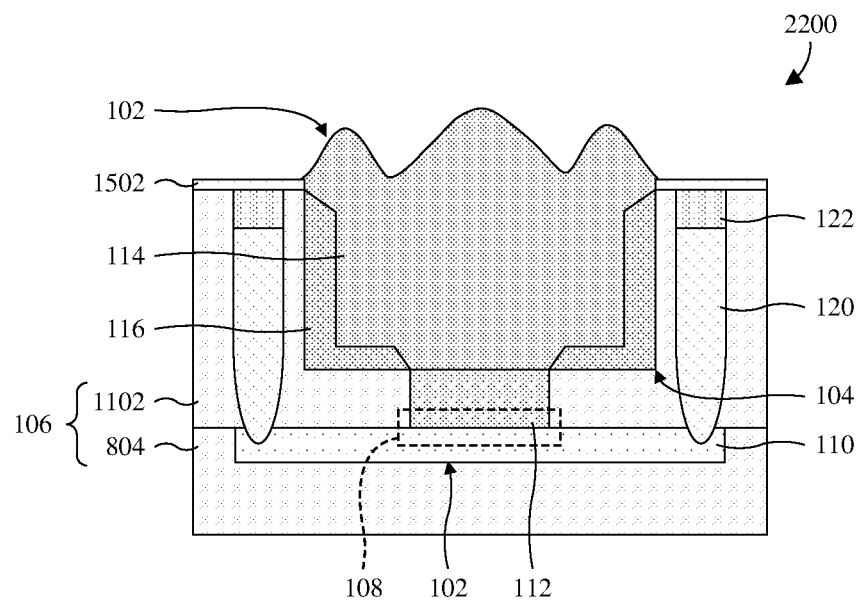

As illustrated by the cross-sectional view 2200 of FIG. 22, an inner absorption layer 114 is epitaxially grown filling a remainder of the trench 1602. The inner absorption layer 114 preferentially grows on semiconductor surfaces, rather than dielectric surfaces. As such, the inner absorption layer 114 grows from the peripheral absorption layer 116 and the second avalanche well 112, but does not grow from the hard mask layer 1502.

The inner absorption layer 114 is semiconductive and has a different semiconductor material than the semiconductor substrate 106. Further, the inner absorption layer 114 has a higher absorption coefficient for targeted radiation than the semiconductor substrate 106 and, in some embodiments, has a smaller bandgap than the semiconductor substrate 106. The inner absorption layer 114 may, for example, be or comprise germanium, a germanium-tin alloy (e.g., GeSn), or the like, and the semiconductor substrate 106 may, for example, be or comprise silicon or the like, when the targeted radiation is long-wavelength radiation.

In some embodiments, doping aside, the inner absorption layer 114 and the peripheral absorption layer 116 are or comprise a same semiconductor material. For example, the inner absorption layer 114 and the peripheral absorption layer 116 may be or comprise germanium, a germanium-tin alloy, or the like. In other embodiments, doping aside, the inner absorption layer 114 and the peripheral absorption layer 116 are or comprise different semiconductor materials. For example, the inner absorption layer 114 may be or comprise germanium or the like, whereas the peripheral absorption layer 116 may be or comprise germanium-tin alloy or the like, or vice versa.

The inner absorption layer 114 is intrinsic (e.g., undoped) or is otherwise lightly doped. The light doping is a doping concentration less than that of the peripheral absorption layer 116 and may, for example, be about 0-5e16 atoms/cm$^3$, about 0-2.5e16 atoms/cm$^3$, about 2.5e16-5e16 atoms/cm$^3$, or some other suitable value.

The inner absorption layer 114 may, for example, be epitaxially grown by MBE, CVD, or some other suitable process. In some embodiments in which the inner absorption layer 114 is or comprises germanium, the epitaxial growth is performed by a CVD process with: 1) a germane (e.g., GeH$_4$) precursor; 2) a temperature of about 350-700 degrees Celsius; and 3) a pressure of about 5-50 torr. In some embodiments in which the inner absorption layer 114 is or comprises a germanium-tin alloy, the epitaxial growth is performed by the CVD process as above except for an additional tin chloride (e.g., SnCl$_4$) precursor. In such embodiments, a ratio of the precursors may be adjusted to limit an atomic percentage of tin to less than 1% or some other suitable value. While the CVD process describes specific precursors, temperatures, and pressures, other suitable precursors, temperatures, and pressures are amenable in alternative embodiments.

Collectively, the inner absorption layer 114 and the peripheral absorption layer 116 form an absorption structure 104 with a higher absorption coefficient for target radiation than the semiconductor substrate 106. The higher absorption coefficient may, for example, be due to the absorption structure 104 having a smaller bandgap than the semiconductor substrate 106. Collectively, the absorption structure 104 and the avalanche region 108 form a photodetector 102, which may, for example, be an SPAD, an avalanche photodiode (APD), or the like. During use of the photodetector 102, the absorption structure 104 enhances absorption of radiation and generation of photo-generated carriers because of the higher absorption coefficient. Further, the avalanche region 108 multiplies photo-generated carriers.

Because the absorption structure 104 is a different semiconductor material than the semiconductor substrate 106, lattice mismatch and/or the like can lead to dark current at an interface between the absorption structure 104 and the semiconductor substrate 106. This may be exacerbated by small bandgaps of the inner absorption layer 114 and the peripheral absorption layer 116 relative to a bandgap of the semiconductor substrate 106. However, because the peripheral absorption layer 116 is highly doped, it is carrier rich and passivates interface states and crystalline defects to suppress the dark current. For example, to the extent that the peripheral absorption layer 116 has a p-type doping, the peripheral absorption layer 116 may be hole rich and may passivate interface states and defects to suppress dark current from electrons.

Figure 23:
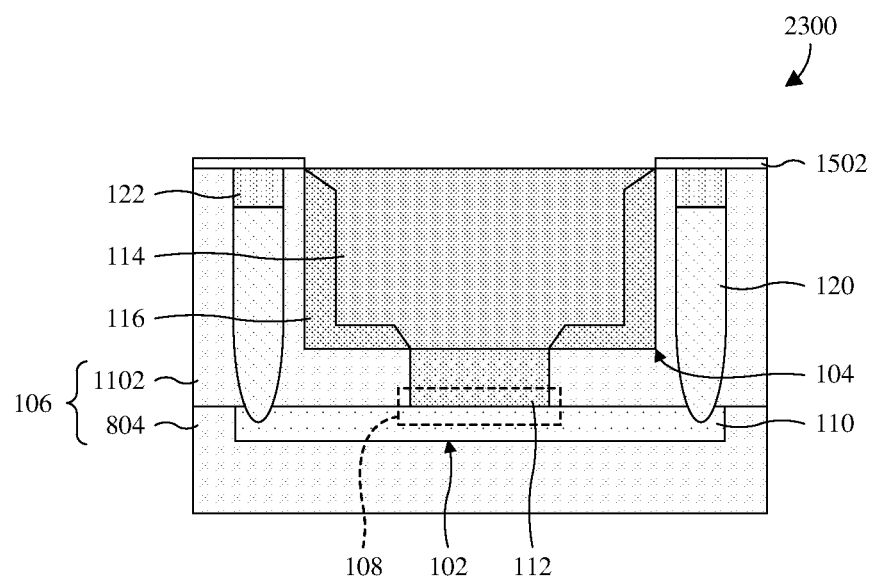

As illustrated by the cross-sectional view 2300 of FIG. 23, a planarization is performed into a top of the inner absorption layer 114 to flatten the top of the inner absorption layer 114. The planarization may, for example, be performed by a chemical mechanical polish (CMP) or some other suitable planarization process.

Figure 24:
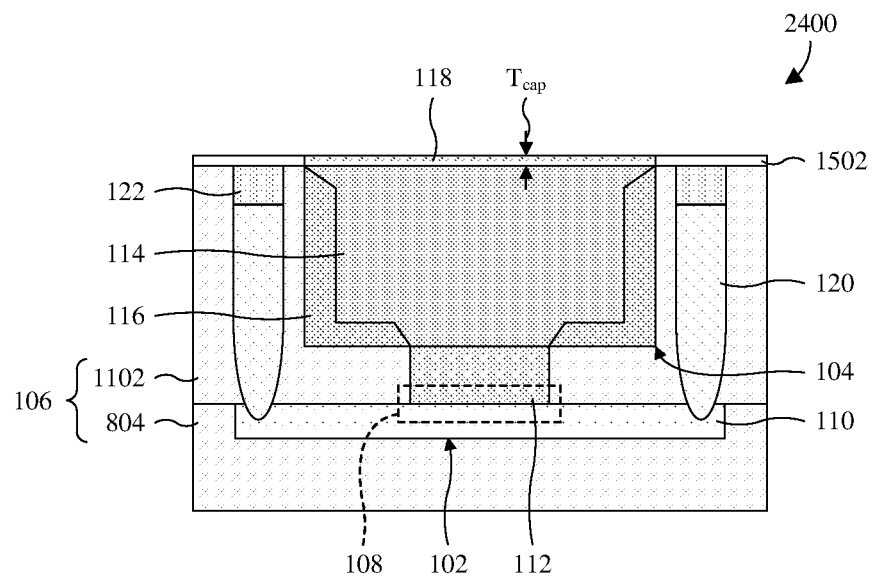

As illustrated by the cross-sectional view 2400 of FIG. 24, a cap layer 118 is epitaxially grown atop the absorption structure 104. The cap layer 118 preferentially grows on semiconductor surfaces, rather than dielectric surfaces. As such, the cap layer 118 grows from the absorption structure 104, but does not grow from the hard mask layer 1502. The cap layer 118 may, for example, be epitaxially grown by MBE, CVD, or some other suitable process.

In some embodiments, a thickness $T_{cap}$ of the cap layer 118 is about 10-100 nanometers, about 10-55 nanometers, about 55-100 nanometers, or some other suitable value. In some embodiments, the thickness $T_{cap}$ is uniform or substantially uniform.

The cap layer 118 is semiconductive and has a different semiconductor material than the inner absorption layer 114 and a different semiconductor material the peripheral absorption layer 116. Further, cap layer 118 has a lower absorption coefficient for targeted radiation than the inner absorption layer 114 and the peripheral absorption layer 116 and, in some embodiments, has a larger bandgap than the inner absorption layer 114 and the peripheral absorption layer 116. The cap layer 118 may, for example, be or comprise silicon or the like, and the inner absorption layer 114 and the peripheral absorption layer 116 may be or comprise germanium, a germanium-tin alloy, or the like. In some embodiments, doping aside, the cap layer 118 and the semiconductor substrate 106 are or comprise a same semiconductor material. For example, the cap layer 118 and the semiconductor substrate 106 may be or comprise silicon or the like.

The cap layer 118 is intrinsic (e.g., undoped) or is otherwise lightly doped. The light doping may, for example, be a doping concentration of about 0-5e16 atoms/cm$^3$, about 0-2.5e16 atoms/cm$^3$, about 2.5e16-5e16 atoms/cm$^3$, or some other suitable value.

Figure 25:
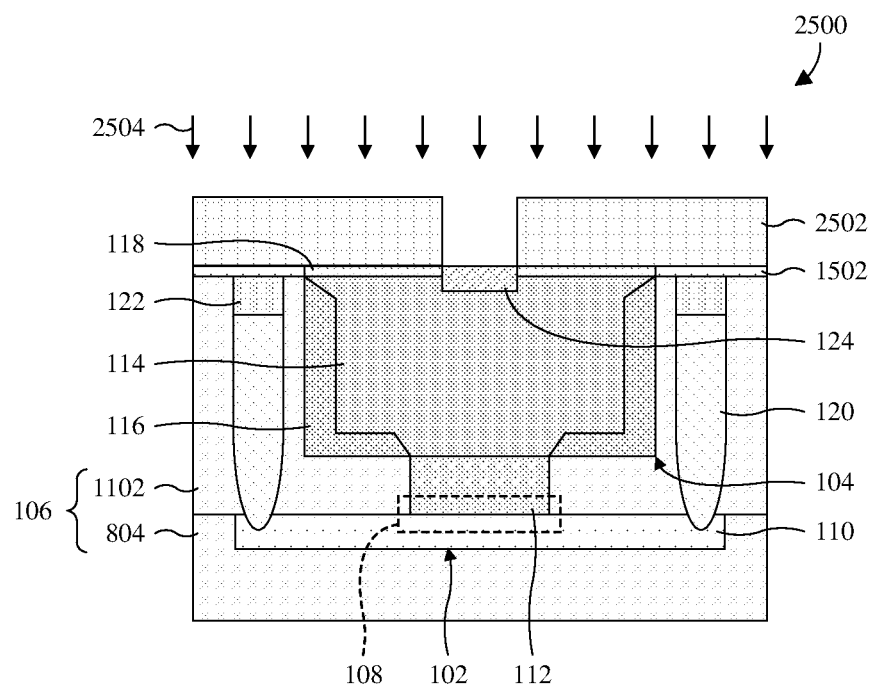

As illustrated by the cross-sectional view 2500 of FIG. 25, the cap layer 118 and the inner absorption layer 114 are selectively doped to form a second contact region 124 overlying the second avalanche well 112. The second contact region 124 has a same doping type as the second avalanche well 112 and the peripheral absorption layer 116.

In some embodiments, a process for performing the selective doping comprises: 1) forming a sixth mask 2502 on the hard mask layer 1502 and the cap layer 118 using photolithography; 2) performing ion implantation 2504 into the cap layer 118 and the inner absorption layer 114 with the sixth mask 2502 in place; and 3) removing the sixth mask 2502. In alternative embodiments, the selective doping is performed by some other suitable process. The sixth mask 2502 may, for example, be or comprise photoresist or some or suitable material.

Figure 26:
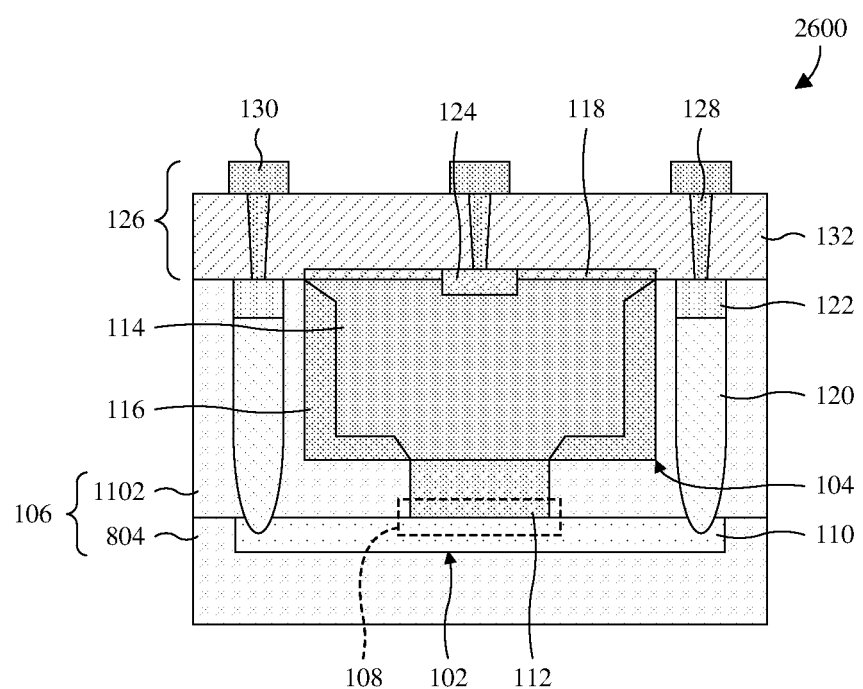

As illustrated by the cross-sectional view 2600 of FIG. 26, the hard mask layer 1502 is removed. The removal may, for example, be performed by an etching process and/or some other suitable type of removal process.

Also illustrated by the cross-sectional view 2600 of FIG. 26, an interconnect structure 126 (partially shown) is formed covering and electrically coupled to the photodetector 102. The interconnect structure 126 comprises a plurality of conductive features, including contacts 128 and wires 130. The contacts 128 are in an ILD layer 132, which separates the wires 130 from the photodetector 102. Further, the contacts 128 extend respectively from the wires 130 respectively to first and second contact regions 122, 124.

During operation of the photodetector 102, one of the first contact region 122 and the second contact region 124 corresponds to an anode of the photodetector 102 and a cathode of the photodetector 102. Further, during operation of the photodetector 102, the photodetector 102 is reverse biased through the interconnect structure 126. To the extent that the photodetector 102 is an APD, the photodetector 102 may, for example, be reverse biased slightly below a reverse-breakdown voltage. To the extent that the photodetector 102 is an SPAD, the photodetector 102 may, for example, be reverse biased above the reverse-break down voltage.

While the photodetector 102 is reverse biased, the photodetector 102 is exposed to target radiation (e.g., long-wavelength radiation, SWIR radiation, or the like). The radiation is absorbed at the absorption structure 104 with high quantum efficiency due to its high absorption coefficient. Absorption leads to photo-generated carriers, which migrate to and are accelerated at the avalanche region 108 by a high electric field across the photodetector 102. The photo-generated carriers are accelerated to a kinetic energy that overcomes ionization energy of the semiconductor substrate 106 and knocks electrons out of atoms of the semiconductor substrate 106. This leads to an avalanche of current carriers that can be measured.

As described above, because the peripheral absorption layer 116 is highly doped, it passivates interface states and crystalline defects to suppress dark current at an interface between the semiconductor substrate 106 and the absorption structure 104. Further, as described above, the peripheral absorption layer 116 may be formed by a self-aligned epitaxial growth process in which the peripheral absorption layer 116 is simultaneously grown and doped on the silicon substrate. This allows the photodetector 102 to be formed at reduced complexity compared to other like photodetectors. For example, the photodetector 102 may be formed without a guard ring in the absorption structure 104, thereby saving a photolithography process and an ion implantation process. As another example, the peripheral absorption layer 116 may be formed without ion implantation and may hence be formed without damaging the semiconductor substrate 106. As such, thermal processing to repair the damage and ion implantation may be saved.

While FIGS. 8-26 are described with reference to a method, it will be appreciated that the structures shown in these figures are not limited to the method but rather may stand alone separate of the method. While FIGS. 8-26 are described as a series of acts, it will be appreciated that the order of the acts may be altered in other embodiments. While FIGS. 8-26 illustrate and describe as a specific set of acts, some acts that are illustrated and/or described may be omitted in other embodiments. Further, acts that are not illustrated and/or described may be included in other embodiments.

Figure 27:
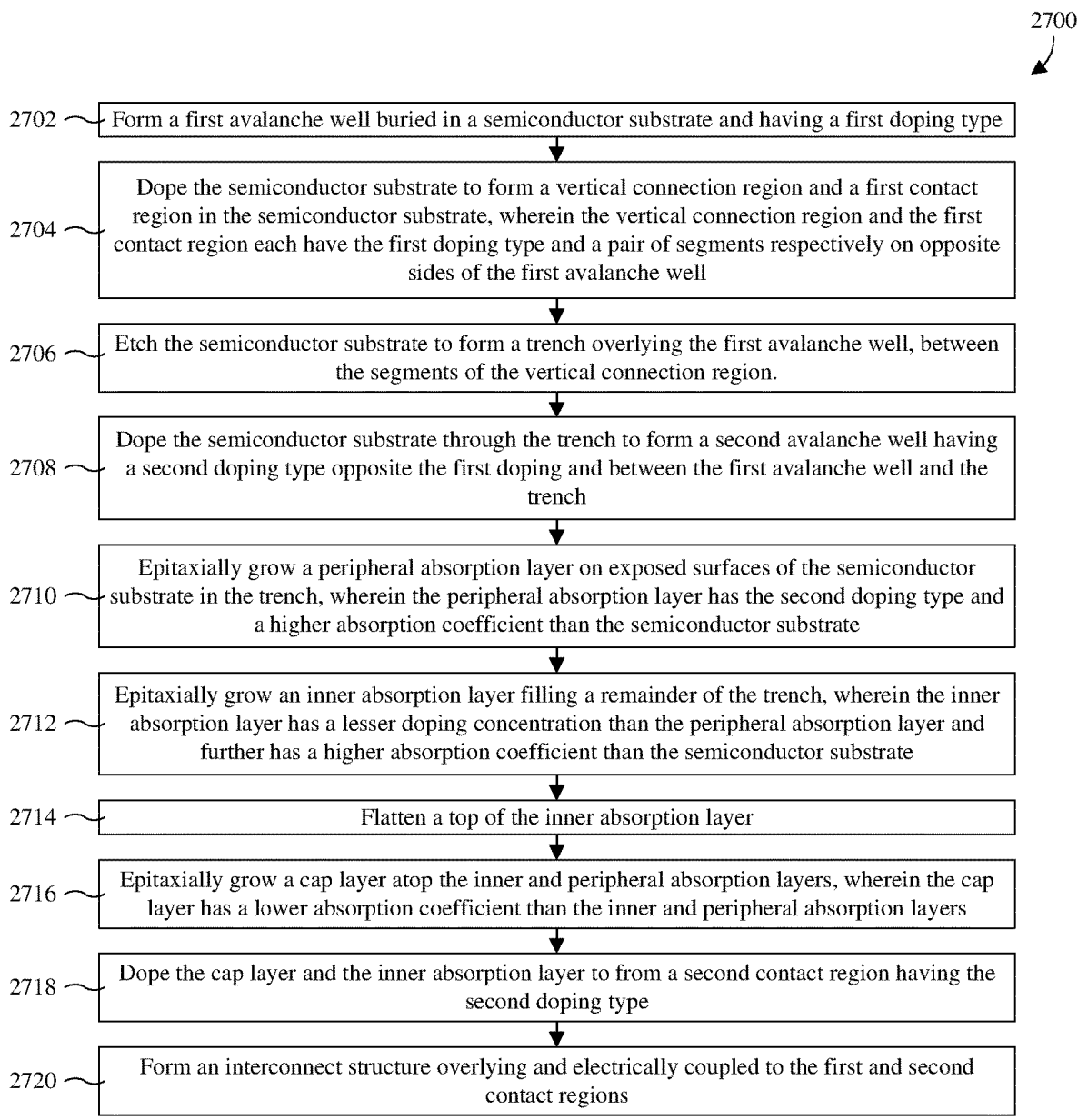
FIG. 27 illustrates a block diagram of some embodiments of the method of FIGS. 8-26.

With reference to FIG. 27, a block diagram 2700 of some embodiments of the method of FIGS. 8-26 is provided.

At 2702, a first avalanche well is formed buried in a semiconductor substrate and having a first doping type. See, for example, FIGS. 8-11.

At 2704, the semiconductor substrate is doped to form a vertical connection region and a first contact region in the semiconductor substrate, wherein the vertical connection region and the first contact region each have the first doping type and a pair of segments respectively on opposite sides of the first avalanche well. See, for example, FIGS. 12-14.

At 2706, the semiconductor substrate is etched to form a trench overlying the first avalanche well, between the segments of the vertical connection region. See, for example, FIGS. 15 and 16.

At 2708, the semiconductor substrate is doped through the trench to form a second avalanche well having a second doping type opposite the first doping and between the first avalanche well and the trench. See, for example, FIGS. 17 and 18.

At 2710, a peripheral absorption layer is epitaxially grown on exposed surfaces of the semiconductor substrate in the trench, wherein the peripheral absorption layer has the second doping type and a higher absorption coefficient than the semiconductor substrate. See, for example, FIGS. 19-21.

At 2712, an inner absorption layer is epitaxially grown filling a remainder of the trench, wherein the inner absorption layer has a lesser doping concentration than the peripheral absorption layer and further has a higher absorption coefficient than the semiconductor substrate. See, for example, FIG. 22.

At 2714, a top of the inner absorption layer is flattened. See, for example, FIG. 23.

At 2716, a cap layer is epitaxially grown atop the inner and peripheral absorption layers, wherein the cap layer has a lower absorption coefficient than the inner and peripheral absorption layers. See, for example, FIG. 24.

At 2718, the cap layer and the inner absorption layer are doped to from a second contact region having the second doping type. See, for example, FIG. 25.

At 2720, an interconnect structure is formed overlying and electrically coupled to the first and second contact regions. See, for example, FIG. 26.

While the block diagram 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 28-32, a series of cross-sectional views 2800-3200 of some alternative embodiments of the method of FIGS. 8-26 is provided in which the peripheral absorption layer 116 has square ends, instead of tapered ends, at a top of the semiconductor substrate 106. The sensor device may, for example, correspond to the sensor device of FIG. 4A or some other suitable sensor device.

Figure 28:
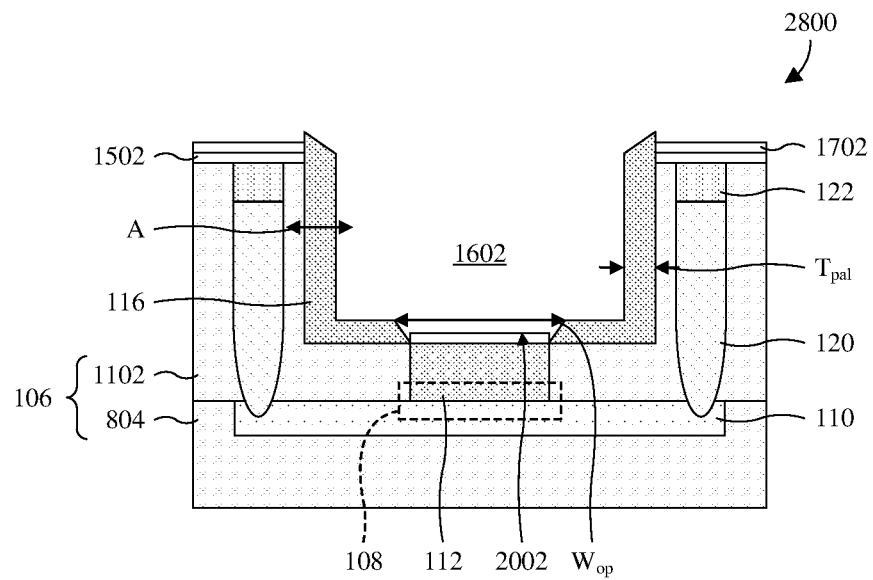
FIGS. 28-32 illustrate a series of cross-sectional views of some alternative embodiments of the method of FIGS. 8-26 in which a peripheral absorption layer has square ends at a top of a semiconductor substrate.

As illustrated by the cross-sectional view 2800 of FIG. 28, the acts described with regard to FIGS. 8-19 are performed. For example, these acts form the first avalanche well 110, the second avalanche well 112, the vertical connection well 120, the first contact region 122, the trench 1602, the hard mask layer 1502, and the third sacrificial layer 1702.

Also illustrated by the cross-sectional view 2800 of FIG. 28, the acts described with regard to FIG. 20 are performed to epitaxially grow the peripheral absorption layer 116 in the trench 1602. However, in contrast with FIG. 20, the epitaxial growth persists until the peripheral absorption layer 116 grows out of the trench 1602.

Figure 29:
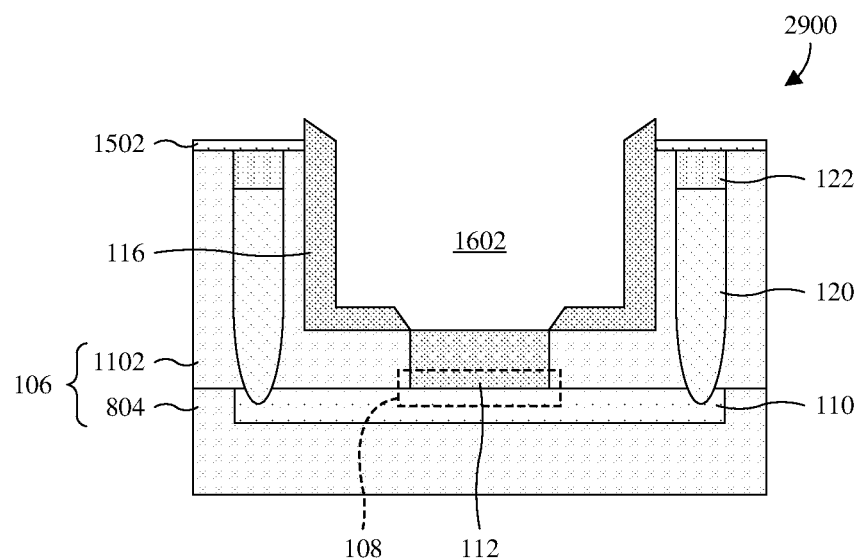

As illustrated by the cross-sectional view 2900 of FIG. 29, the acts described with regard to FIG. 21 are performed to remove the third sacrificial layer 1702.

Figure 30:
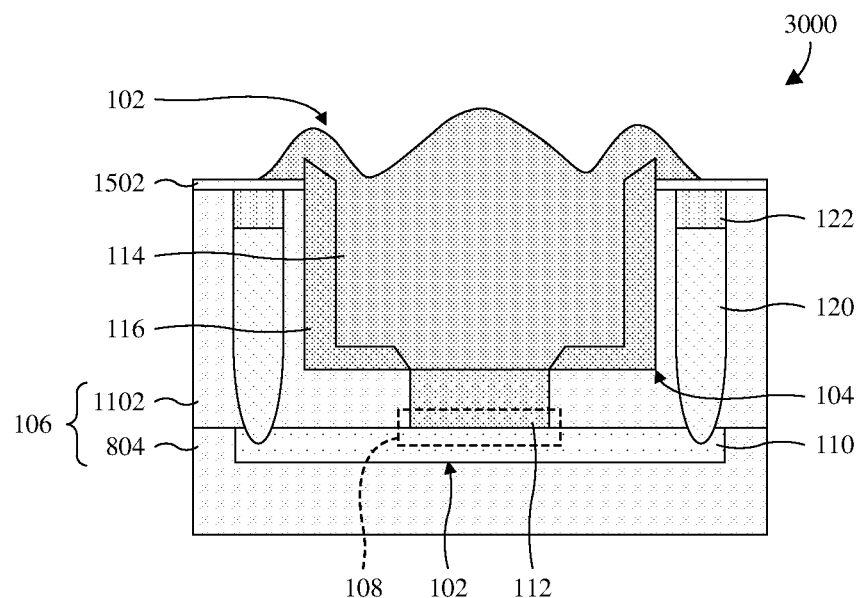

As illustrated by the cross-sectional view 3000 of FIG. 30, the acts described with regard to FIG. 22 are performed to epitaxially grow an inner absorption layer 114 filling a remainder of the trench 1602.

Figure 31:
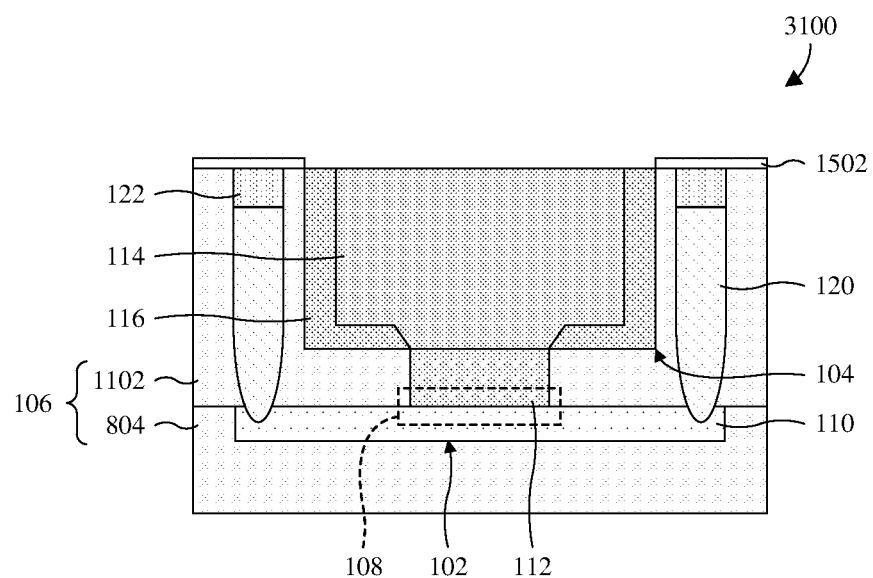

As illustrated by the cross-sectional view 3100 of FIG. 31, the acts described with regard to FIG. 23 are performed to planarize a top of the inner absorption layer 114 and to flatten the top of the inner absorption layer 114. Because the peripheral absorption layer 116 was epitaxially grown extending out of the trench 1602, the planarization further extends into the inner absorption layer 114 and squares ends of the peripheral absorption layer 116 at a top of the peripheral absorption layer 116. Compared to tapered ends, square ends better reduce dark current at the top of the peripheral absorption layer 116.

Figure 32:
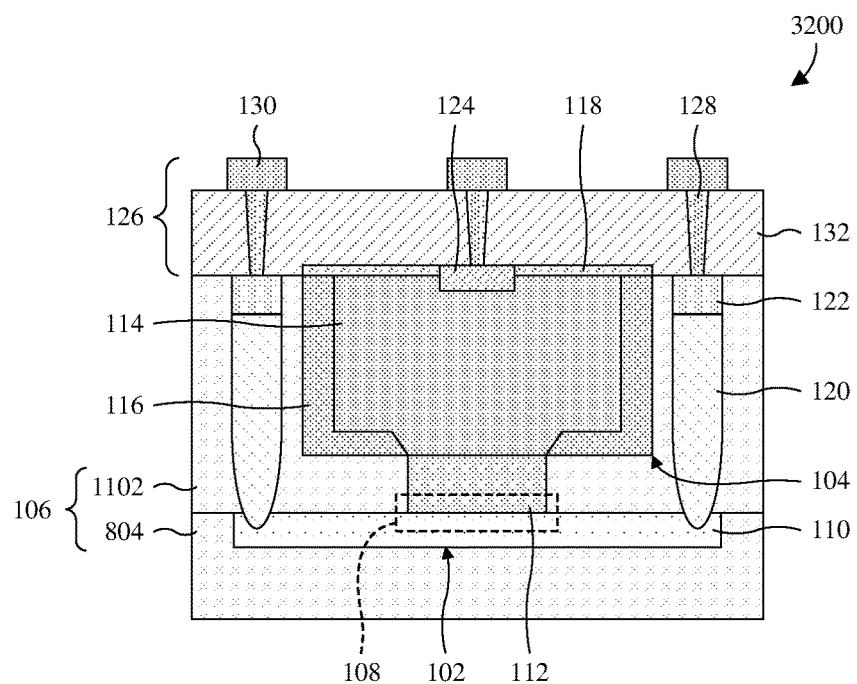

As illustrated by the cross-sectional view 3200 of FIG. 32, the acts described with regard to FIGS. 24-26 are performed. For example, these acts form the cap layer 118, the second contact region 124, and the interconnect structure 126 and further remove the hard mask layer 1502.

While FIGS. 28-32 are described with reference to a method, it will be appreciated that the structures shown in these figures are not limited to the method but rather may stand alone separate of the method. While FIGS. 28-32 are described as a series of acts, it will be appreciated that the order of the acts may be altered in other embodiments. While FIGS. 28-32 illustrate and describe as a specific set of acts, some acts that are illustrated and/or described may be omitted in other embodiments. Further, acts that are not illustrated and/or described may be included in other embodiments.

With reference to FIGS. 33-36, a series of cross-sectional views 3300-3600 of some alternative embodiments of the method of FIGS. 8-26 is provided in which the peripheral absorption layer 116 has square ends at the second avalanche well 112. The sensor device may, for example, correspond to the sensor device of FIG. 4B or some other suitable sensor device.

Figure 33:
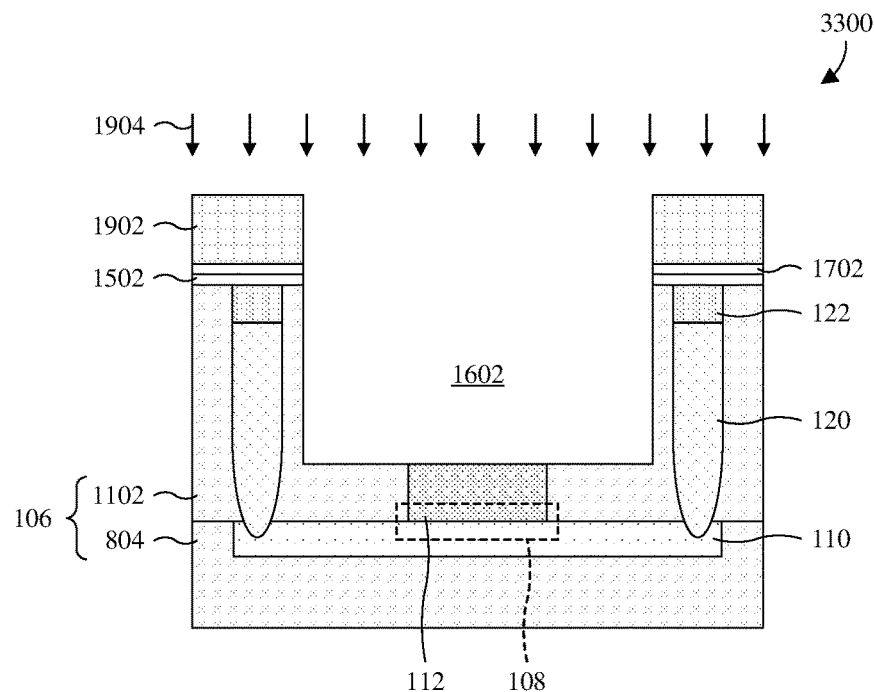
FIGS. 33-36 illustrate a series of cross-sectional views of some alternative embodiments of the method of FIGS. 8-26 in which a peripheral absorption layer has square ends at a second avalanche well.

As illustrated by the cross-sectional view 3300 of FIG. 33, the acts described with regard to FIGS. 8-18 are performed. For example, these acts form the first avalanche well 110, the second avalanche well 112, the vertical connection well 120, the first contact region 122, the trench 1602, the hard mask layer 1502, and the third sacrificial layer 1702.

Also illustrated by the cross-sectional view 3300 of FIG. 33, the acts described with regard to FIG. 19 are performed to selectively etch the third sacrificial layer 1702 and to remove portions of the third sacrificial layer 1702 in the trench 1602. However, in contrast with FIG. 19, the selective etch further removes the third sacrificial layer 1702 from atop the second avalanche well 112. As a result, in at least some embodiments, the selective etch wholly removes the third sacrificial layer 1702 from the trench 1602.

Figure 34:
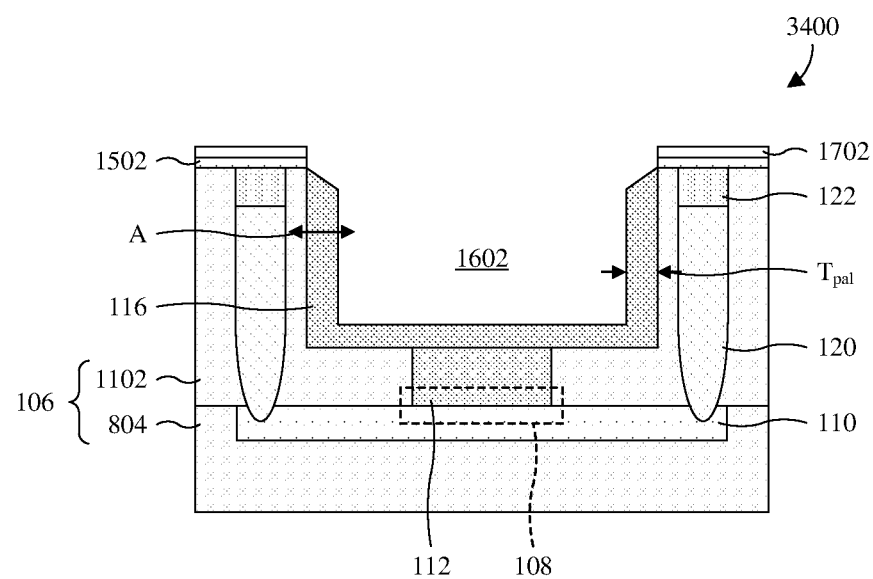

As illustrated by the cross-sectional view 3400 of FIG. 34, the acts described with regard to FIG. 20 are performed to epitaxially grow the peripheral absorption layer 116 in the trench 1602. However, in contrast FIG. 20, the peripheral absorption layer 116 grows on the second avalanche well 112 because the third sacrificial layer 1702 does not mask the second avalanche well 112. Hence, the peripheral absorption layer 116 has a U-shaped profile or the like.

Figure 35:
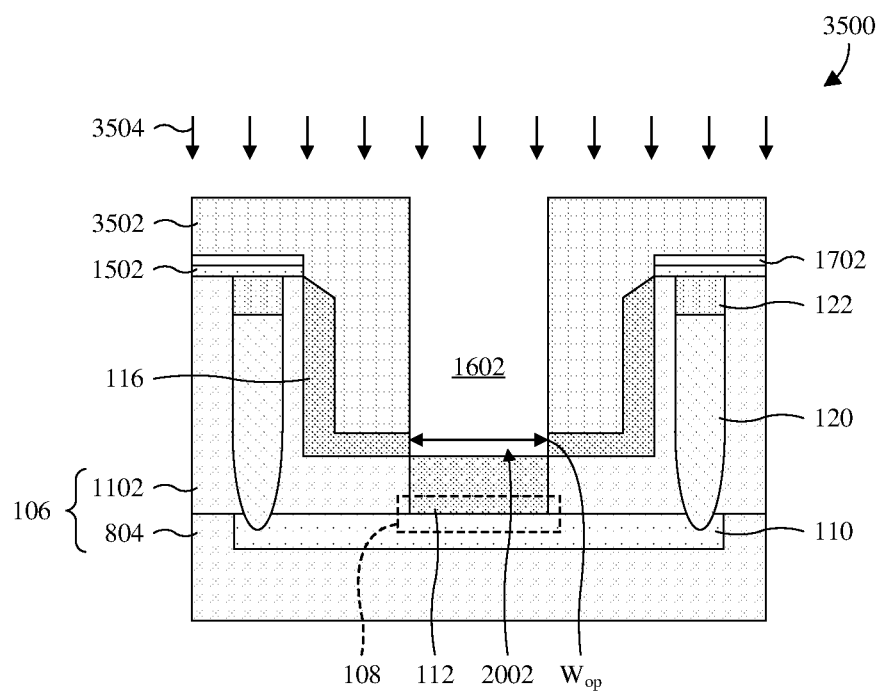

As illustrated by the cross-sectional view 3500 of FIG. 35, the peripheral absorption layer 116 is selectively etched to form an opening 2002 exposing the second avalanche well 112. In some embodiments, a width $W_{op}$ of the opening 2002 is about 0.5-2 micrometers, about 0.5-1.25 micrometers, about 1.25-2 micrometers, or some other suitable value.

In some embodiments, a process for performing the selective etching comprises: 1) forming a seventh mask 3502 on the third sacrificial layer 1702 and the peripheral absorption layer 116 using photolithography; 2) performing an etch 3504 into the peripheral absorption layer 116 with the seventh mask 3502 in place; and 3) removing the seventh mask 3502. In alternative embodiments, the selective etching is performed by some other suitable process. The seventh mask 3502 may, for example, be or comprise photoresist or some or suitable material.

Because ends of the peripheral absorption layer 116 at the second avalanche well 112 are formed by the selective etching, the ends are square rather than tapered. Compared to tapered ends, square ends better reduce dark current at the second avalanche well 112.

Figure 36:
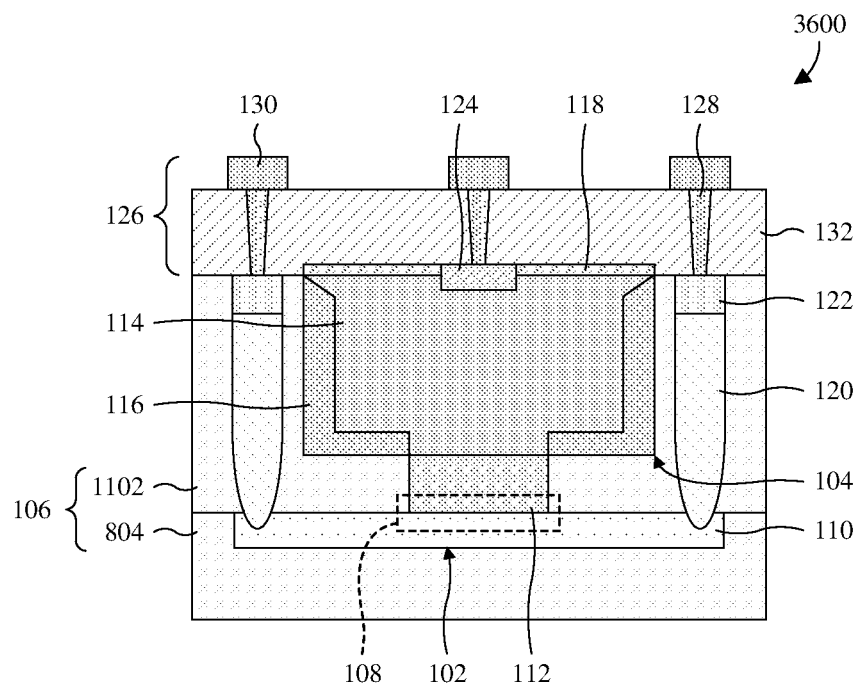

As illustrated by the cross-sectional view 3600 of FIG. 36, the acts described with regard to FIGS. 22-26 are performed. For example, these acts form the inner absorption layer 114, the cap layer 118, the second contact region 124, and the interconnect structure 126 and further remove the hard mask layer 1502. Further, while removing the hard mask layer 1502 as described with regard to FIG. 26, the third sacrificial layer 1702 is removed.

While FIGS. 33-36 are described with reference to a method, it will be appreciated that the structures shown in these figures are not limited to the method but rather may stand alone separate of the method. While FIGS. 33-36 are described as a series of acts, it will be appreciated that the order of the acts may be altered in other embodiments. While FIGS. 33-36 illustrate and describe as a specific set of acts, some acts that are illustrated and/or described may be omitted in other embodiments. Further, acts that are not illustrated and/or described may be included in other embodiments.

With reference to FIGS. 37-41, a series of cross-sectional views 3700-4100 of some alternative embodiments of the method of FIGS. 8-26 in which a peripheral absorption layer has square ends at a top of a semiconductor substrate and a second avalanche well. The sensor device may, for example, correspond to the sensor device of FIG. 4C or some other suitable sensor device.

Figure 37:
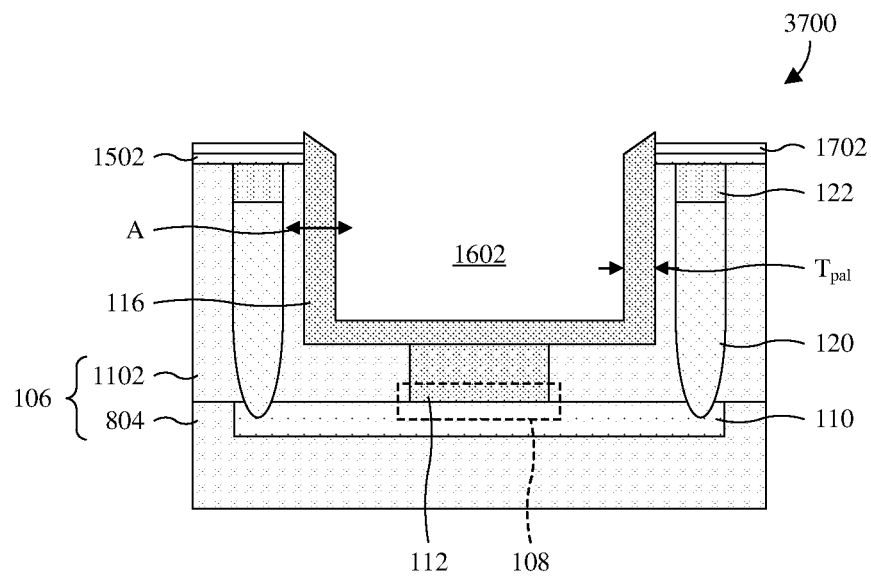
FIGS. 37-41 illustrate a series of cross-sectional views of some alternative embodiments of the method of FIGS. 8-26 in which a peripheral absorption layer has square ends at a top of a semiconductor substrate and at a second avalanche well.

As illustrated by the cross-sectional view 3700 of FIG. 37, the acts described with regard to 33 are performed. For example, these acts form the first avalanche well 110, the second avalanche well 112, the vertical connection well 120, the first contact region 122, the trench 1602, the hard mask layer 1502, and the third sacrificial layer 1702.

Also illustrated by the cross-sectional view 3700 of FIG. 37, the peripheral absorption layer 116 is epitaxially grown in the trench 1602 in accordance with the acts described with regard to FIG. 29. Hence, the peripheral absorption layer 116 grows out of the trench 1602.

Figure 38:
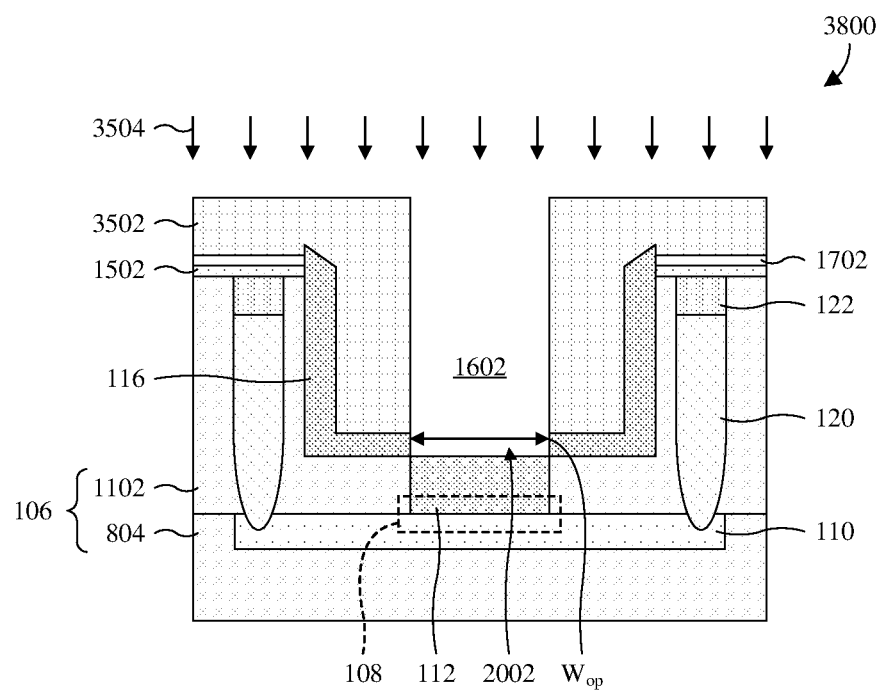

As illustrated by the cross-sectional view 3800 of FIG. 38, the acts described with regard to FIG. 35 are performed to selectively etch the peripheral absorption layer 116 and to form an opening 2002 exposing the second avalanche well 112. Because ends of the peripheral absorption layer 116 at the second avalanche well 112 are formed by the selective etching, the ends are square rather than tapered. Compared to tapered ends, square ends better reduce dark current at the second avalanche well 112.

Figure 39:
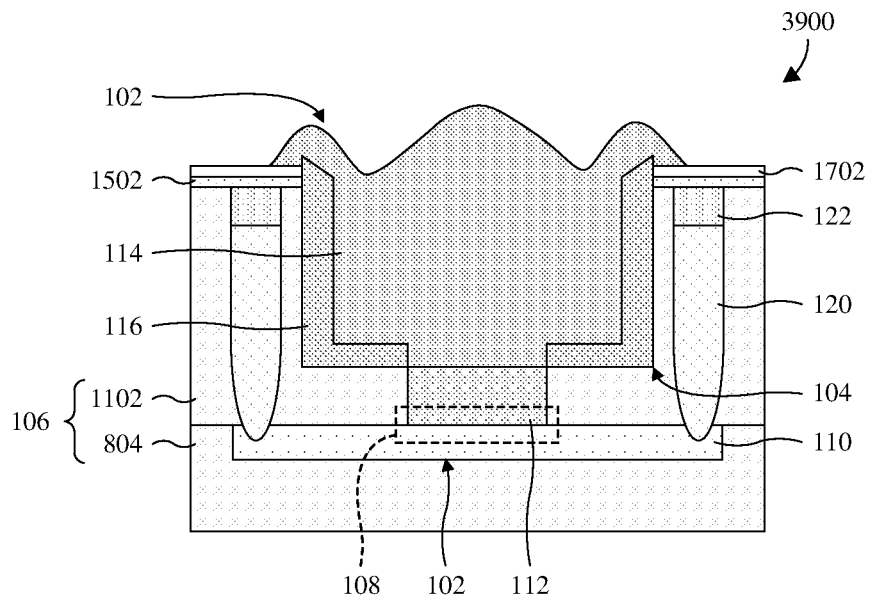

As illustrated by the cross-sectional view 3900 of FIG. 39, the acts described with regard to FIG. 30 are performed to epitaxially grow an inner absorption layer 114 filling a remainder of the trench 1602.

Figure 40:
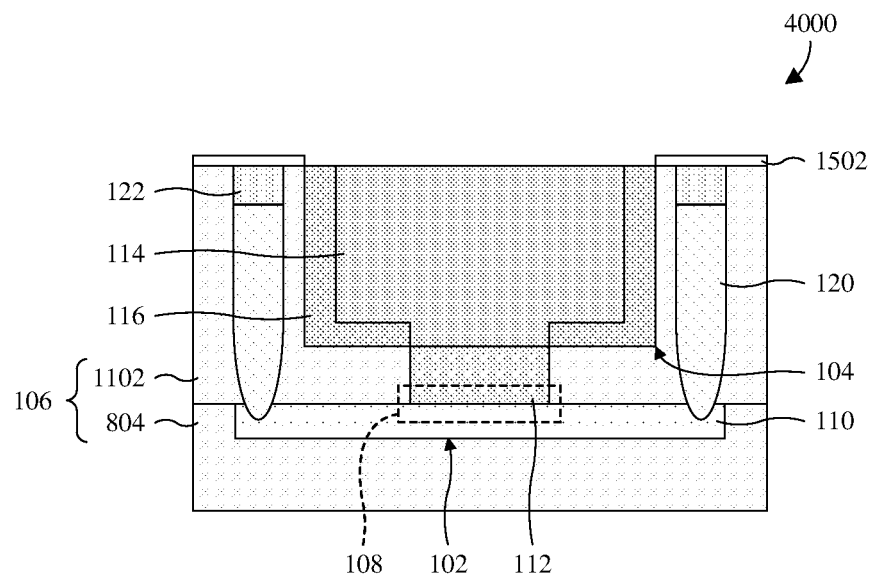

As illustrated by the cross-sectional view 4000 of FIG. 40, the acts described with regard to FIG. 31 are performed to planarize a top of the inner absorption layer 114 and to flatten the top of the inner absorption layer 114. Further, in contrast with FIG. 31, the planarization removes the third sacrificial layer 1702. Because the planarization extends into the inner absorption layer 114, the planarization squares ends of the peripheral absorption layer 116 at a top of the peripheral absorption layer 116. Compared to tapered ends, square ends better reduce dark current at the top of the peripheral absorption layer 116.

Figure 41:
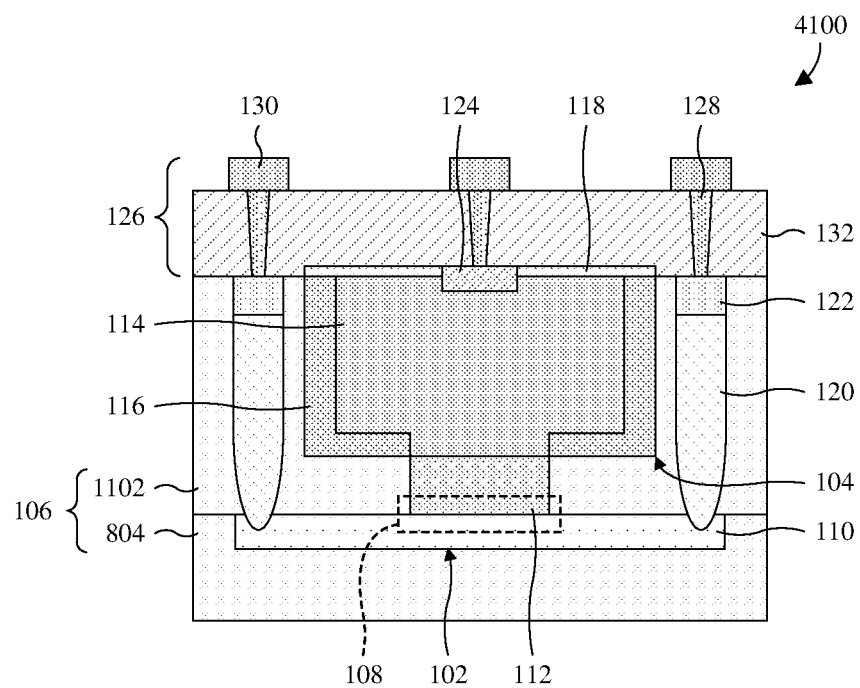

As illustrated by the cross-sectional view 4100 of FIG. 41, the acts described with regard to FIG. 32 are performed. For example, these acts form the cap layer 118, the second contact region 124, and the interconnect structure 126 and further remove the hard mask layer 1502.

While FIGS. 37-41 are described with reference to a method, it will be appreciated that the structures shown in these figures are not limited to the method but rather may stand alone separate of the method. While FIGS. 37-41 are described as a series of acts, it will be appreciated that the order of the acts may be altered in other embodiments. While FIGS. 37-41 illustrate and describe as a specific set of acts, some acts that are illustrated and/or described may be omitted in other embodiments. Further, acts that are not illustrated and/or described may be included in other embodiments.

In some embodiments, the present disclosure provides a semiconductor structure for a photodetector, including: a semiconductor substrate including an avalanche region at which a p-type region and an n-type region form a PN junction; an inner absorption layer recessed into the semiconductor substrate, wherein the inner absorption layer has a bottom protrusion protruding towards the avalanche region; and a peripheral absorption layer on a sidewall of the inner absorption layer and a bottom of the inner absorption layer and further extending from the sidewall to the bottom protrusion; wherein the inner absorption layer and the peripheral absorption layer share a common semiconductor material and have a smaller bandgap than the semiconductor substrate, and the peripheral absorption layer has a doping concentration that is elevated relative to a doping concentration of the inner absorption layer. In some embodiments, the peripheral absorption layer has a slanted sidewall facing and directly contacting the bottom protrusion. In some embodiments, the peripheral absorption layer has a vertical sidewall facing and directly contacting the bottom protrusion, and wherein the vertical sidewall extends orthogonal to a top surface of the semiconductor substrate. In some embodiments, an end of the peripheral absorption layer at a top surface of the semiconductor substrate is square. In some embodiments, an end of the peripheral absorption layer at a top surface of the semiconductor substrate is tapered. In some embodiments, the doping concentration of the peripheral absorption layer is uniform across a thickness of the peripheral absorption layer. In some embodiments, the bottom protrusion protrudes to one of the p-type region and the n-type region, and wherein the peripheral absorption layer has a same doping type as the one of the p-type region and the n-type region.

In some embodiments, the present disclosure provides a sensor device, including: a silicon substrate; a first well buried in the silicon substrate and having a first doping type; a second well over and directly on the first well in the silicon substrate, wherein the second well has a second doping type opposite the first doping type; a germanium structure overlying the second well and recessed into the silicon substrate; an undoped region in the germanium structure; and a doped region in the germanium structure; wherein the doped region wraps around a bottom corner of the undoped region to separate the bottom corner from the silicon substrate, and the first and second wells and the germanium structure form a photodetector. In some embodiments, the germanium structure includes tin. In some embodiments, a doping concentration of the doped region decreases from the silicon substrate to the undoped region. In some embodiments, the germanium structure and the silicon substrate directly contact at an interface, wherein the doped region lines the interface continuously from the second well to a top corner of the silicon substrate. In some embodiments, the first well has a larger width than the germanium structure, wherein the second well has a smaller width than the germanium structure. In some embodiments, the sensor device further includes a silicon layer covering the germanium structure. In some embodiments, the sensor device further includes a third well extending laterally in a closed path around the germanium structure, and further extending vertically from a periphery of the first well to a top of the silicon substrate, wherein third well has the first doping type.

In some embodiments, the present disclosure provides a method for forming a photodetector, the method including: forming a first well buried in a semiconductor substrate and having a first doping type; performing a first etch into the semiconductor substrate to form a trench overlying and spaced from the first well; doping the semiconductor substrate through the trench to form a second well on the first well, wherein the second well has a second doping type opposite the first doping type; epitaxially growing a peripheral absorption layer on exposed surfaces of the semiconductor substrate in the trench and having the second doping type; and epitaxially growing an inner absorption layer filling a remainder of the trench over the peripheral absorption layer; wherein the peripheral absorption layer and the inner absorption layer are semiconductive and have smaller bandgaps than the semiconductor substrate. In some embodiments, the epitaxial growing of the peripheral absorption layer is performed while the second well is masked. In some embodiments, the method further includes: depositing a sacrificial layer lining the trench, wherein the doping is performed through the sacrificial layer; and performing a second etch into the sacrificial layer to clear the sacrificial layer from a sidewall of the semiconductor substrate in the trench, wherein a remainder of the sacrificial layer covers the second well upon completion of the second etch; wherein the epitaxial growing of the peripheral absorption layer is performed with the remainder of the sacrificial layer in place. In some embodiments, the epitaxial growing of the peripheral absorption layer is performed while the second well is exposed in the trench, wherein the method further includes: performing a second etch into the peripheral absorption layer to form an opening exposing the second well before the epitaxial growing of the inner absorption layer. In some embodiments, the method further includes: epitaxially growing a cap layer atop the peripheral absorption layer and the inner absorption layer, wherein the cap layer is semiconductive and has a same bandgap as the semiconductor substrate. In some embodiments, the epitaxial growing of the peripheral absorption layer persists long enough for the peripheral absorption layer to grow outside the trench, wherein the method further includes performing a planarization into the peripheral absorption layer and the inner absorption layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photodetector, the method comprising:
    forming a first well buried in a semiconductor substrate and having a first doping type;
    performing a first etch into the semiconductor substrate to form a trench overlying and spaced from the first well;
    doping the semiconductor substrate through the trench to form a second well on the first well, wherein the second well has a second doping type opposite the first doping type;
    epitaxially growing a peripheral absorption layer on exposed surfaces of the semiconductor substrate in the trench and having the second doping type; and
    epitaxially growing an inner absorption layer filling a remainder of the trench over the peripheral absorption layer;
    wherein the peripheral absorption layer and the inner absorption layer are semiconductive and have smaller bandgaps than the semiconductor substrate.

2. The method according to claim 1, wherein the epitaxial growing of the peripheral absorption layer is performed while the second well is masked.

3. The method according to claim 1, further comprising:
    depositing a sacrificial layer lining the trench, wherein the doping is performed through the sacrificial layer; and
    performing a second etch into the sacrificial layer to clear the sacrificial layer from a sidewall of the semiconductor substrate in the trench, wherein a remainder of the sacrificial layer covers the second well upon completion of the second etch;
    wherein the epitaxial growing of the peripheral absorption layer is performed with the remainder of the sacrificial layer in place.

4. The method according to claim 1, wherein the epitaxial growing of the peripheral absorption layer is performed while the second well is exposed in the trench, and wherein the method further comprises:
    performing a second etch into the peripheral absorption layer to form an opening exposing the second well before the epitaxial growing of the inner absorption layer.

5. The method according to claim 1, further comprising:
    epitaxially growing a cap layer atop the peripheral absorption layer and the inner absorption layer, wherein the cap layer is semiconductive and has a same bandgap as the semiconductor substrate.

6. The method according to claim 1, wherein the epitaxial growing of the peripheral absorption layer persists long enough for the peripheral absorption layer to grow outside the trench, and wherein the method further comprises:
    performing a planarization into the peripheral absorption layer and the inner absorption layer.

7. The method according to claim 1, wherein the inner absorption layer has a bottom protrusion protruding through the peripheral absorption layer to the second well, which extends to the first well.

8. A method for forming a photodetector, the method comprising:
    performing a first etch into a semiconductor substrate to form a trench;
    forming a mask partially filling the trench at a width-wise center of the trench;
    epitaxially growing a peripheral absorption layer lining surfaces of the semiconductor substrate in the trench with the mask in place;
    removing the mask; and
    epitaxially growing an inner absorption layer filling a remainder of the trench over the peripheral absorption layer after the mask is removed;
    wherein the peripheral absorption layer and the inner absorption layer share a semiconductor material different than a semiconductor material of the semiconductor substrate.

9. The method according to claim 8, wherein the semiconductor material of the peripheral absorption layer and the inner absorption layer comprises germanium, and wherein the peripheral absorption layer and the inner absorption layer have different doping concentrations.

10. The method according to claim 8, further comprising:
    doping the semiconductor substrate through the trench to form a well extending into the semiconductor substrate from the trench and having a width less than a width of the trench, wherein the mask is formed atop the well.

11. The method according to claim 8, further comprising:
    depositing a sacrificial layer overlying the semiconductor substrate and lining the trench, wherein the mask is formed overlying the sacrificial layer; and
    performing a second etch into the sacrificial layer with the mask in place to expose the surfaces of the semiconductor substrate before epitaxially growing the peripheral absorption layer.

12. The method according to claim 11, further comprising:
    performing a third etch to remove a remaining portion of the sacrificial layer in the trench between epitaxially growing the peripheral absorption layer and epitaxially growing the inner absorption layer.

13. The method according to claim 8, further comprising:
    forming a first additional well buried in the semiconductor substrate, wherein the first additional well has a width less than a width of the semiconductor substrate and a doping type opposite to a doping type of the peripheral absorption layer, and wherein the trench is formed overlying and spaced from the first additional well.

14. The method according to claim 13, further comprising:

forming a second additional well extending from a top of the semiconductor substrate to the first additional well and further extending in a closed path around a portion of the semiconductor substrate, wherein the second additional well has a same doping type as the first additional well, and wherein the trench is formed in the portion of the semiconductor substrate spaced from and surrounded by the second additional well.

15. A method for forming a photodetector, the method comprising:

performing a first etch into a semiconductor substrate to form a trench;

doping the semiconductor substrate through the trench to form a well extending into the semiconductor substrate and having a width less than a width of the trench;

epitaxially growing a peripheral absorption layer lining surfaces of the semiconductor substrate in the trench;

performing a second etch into the peripheral absorption layer to form an opening exposing the well in the trench;

epitaxially growing an inner absorption layer filling a remainder of the trench over the peripheral absorption layer and extending to the well through the opening;

wherein the peripheral absorption layer and the inner absorption layer are semiconductive and have individual bandgaps less than a bandgap of the semiconductor substrate.

16. The method according to claim 15, wherein the peripheral absorption layer has a U-shaped profile.

17. The method according to claim 15, wherein the peripheral absorption layer only partially fills the trench, lines sidewalls of the semiconductor substrate in the trench, and lines a surface of the semiconductor substrate at a bottom of the trench.

18. The method according to claim 15, wherein a top surface of the peripheral absorption layer extends outside of the trench with a downward slant towards a width-wise center of the trench.

19. The method according to claim 15, wherein the well and the peripheral absorption layer share a common doping type.

20. The method according to claim 15, wherein a doping concentration of the peripheral absorption layer decreases from the semiconductor substrate to the inner absorption layer.

* * * * *